(12) United States Patent
Gu et al.

(10) Patent No.: US 11,740,389 B2
(45) Date of Patent: Aug. 29, 2023

(54) LOW REFLECTION STRUCTURE, DISPLAY PANEL, DISPLAY DEVICE AND MANUFACTURING METHOD OF A DISPLAY PANEL

(71) Applicant: Xiamen Tianma Micro-Electronics Co., Ltd., Xiamen (CN)

(72) Inventors: Yuefeng Gu, Shanghai (CN); Jiandong Wang, Shanghai (CN); Xiongping Li, Shanghai (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 297 days.

(21) Appl. No.: 17/138,457

(22) Filed: Dec. 30, 2020

(65) Prior Publication Data

US 2022/0099865 A1 Mar. 31, 2022

(30) Foreign Application Priority Data

Sep. 29, 2020 (CN) .......................... 202011056170.3

(51) Int. Cl.
*G02B 27/01* (2006.01)
*B60K 35/00* (2006.01)
(Continued)

(52) U.S. Cl.
CPC ............ *G02B 3/0037* (2013.01); *B60K 35/00* (2013.01); *G02B 5/003* (2013.01);
(Continued)

(58) Field of Classification Search
CPC .. G02B 3/0037; G02B 3/0062; G02B 3/0068; G02B 5/003; G02B 27/0101; G02B 2027/0118; B60K 35/00; B60K 2370/1529

See application file for complete search history.

(56) References Cited

U.S. PATENT DOCUMENTS

| 6,231,200 B1 | 5/2001 | Shinohara et al. |
| 2021/0286963 A1* | 9/2021 | Gao .................... G06V 40/1318 |

FOREIGN PATENT DOCUMENTS

| CN | 103185980 A | 7/2013 |
| CN | 105182553 A | 12/2015 |
| CN | 108681703 A | 10/2018 |

OTHER PUBLICATIONS

Chinese Office Action related to Application No. 202011056170.3; dated Oct. 13, 2021.

* cited by examiner

*Primary Examiner* — Ryan D Howard
(74) *Attorney, Agent, or Firm* — von Briesen & Roper, s.c.

(57) ABSTRACT

Provided are a low reflection structure, a display panel, a display device, and a manufacturing method of a display panel. Related is the field of display technologies. The low reflection structure includes a first lens array, a second lens array, and a light blocking layer located between the first lens array and the second lens array. The first lens array includes multiple first convex lenses. The second lens array includes multiple second convex lenses. The light blocking layer includes a light blocking part and multiple light transmitting parts. The light blocking part at least partially surrounds the multiple light transmitting parts. An image focal plane of the first convex lens and an object focal plane of the second convex lens are within a same plane. A focus of each first convex lens of the multiple first convex lenses is located within a light transmitting part of the multiple light transmitting parts.

20 Claims, 22 Drawing Sheets

(51) Int. Cl.
*G02B 3/00* (2006.01)
*G02B 5/00* (2006.01)
*G02F 1/1335* (2006.01)

(52) U.S. Cl.
CPC .. *G02B 27/0101* (2013.01); *B60K 2370/1529* (2019.05); *B60K 2370/23* (2019.05); *B60K 2370/25* (2019.05); *G02B 2027/0118* (2013.01); *G02F 1/133502* (2013.01)

LOW REFLECTION STRUCTURE, DISPLAY PANEL, DISPLAY DEVICE AND MANUFACTURING METHOD OF A DISPLAY PANEL

CROSS-REFERENCE TO RELATED APPLICATION

This application claims priority to Chinese Patent Application No. 202011056170.3 filed Sep. 29, 2020, the disclosure of which is incorporated herein by reference in its entirety.

TECHNICAL FIELD

The present disclosure relates to the field of display technologies and, in particular, to a low reflection structure, a display panel, a display device, and a manufacturing method of a display panel.

BACKGROUND

With the development of science and technology and the advancement of society, people are increasingly dependent on information exchange and transmission and the like. As a main carrier and material basis of the information exchange and transmission, a display device has become a hot research topic for many scientists.

To prevent the display device from reflecting external ambient light, a reflection reducing film is generally disposed in the display device. The reflection reducing film usually includes an alternatively stacked structure formed by high refractivity materials and low refractivity materials. However, the reflection reducing film has a limited effect in reducing the reflectivity, so the reflectivity is still high, and a requirement for both low reflectivity and high hue cannot be implemented simultaneously.

SUMMARY

The present disclosure provides a low reflection structure, a display panel, a display device, and a manufacturing method of a display panel, so as to reduce the reflectivity to external ambient light and implement a requirement for both low reflectivity and high hue simultaneously.

In a first aspect, an embodiment of the present disclosure provides a low reflection structure. The low reflection structure includes a first lens array, a second lens array, and a light blocking layer located between the first lens array and the second lens array. The first lens array includes multiple first convex lenses. The second lens array includes multiple second convex lenses. The light blocking layer includes a light blocking part and multiple light transmitting parts. The light blocking part at least partially surrounds the multiple light transmitting parts. A focus of each first convex lens is located within a light transmitting part of the multiple light transmitting parts. An image focal plane of the each first convex lens and an object focal plane of each second convex lens are within a same plane.

In a second aspect, an embodiment of the present disclosure provides a display panel. The display panel includes a display box and the low reflection structure according to the first aspect. The low reflection structure is located on a display side of the display box.

In a third aspect, an embodiment of the present disclosure provides a display device. The display panel includes the display panel according to the second aspect.

In a fourth aspect, an embodiment of the present disclosure provides a manufacturing method of a display panel. The method includes the steps described blow. A display box is provided. A first lens array and a first dielectric layer are formed in an exposing and developing manner on a display side of the display box. A second dielectric layer is provided. A light blocking layer is formed on a surface of one side of the second dielectric layer. A second lens array is formed in an exposing and developing manner on a surface of one side of second dielectric layer away from the light blocking layer. The one side of the second dielectric layer on which the light blocking layer is formed is fitted with the one side of the display box on which the first lens array is formed. The first lens array includes multiple first convex lenses. The second lens array includes multiple second convex lenses. The light blocking layer includes a light blocking part and multiple light transmitting parts. The light blocking part at least partially surrounds the multiple light transmitting parts. A focus of each first convex lens is in a light transmitting part of the multiple light transmitting parts. An image focal plane of the each first convex lens and an object focal plane of each second convex lens are within a same plane.

In the embodiments of the present disclosure, light incident on one side of the first lens array is incident on the first convex lens of the first lens array at an inclined angle, so that the light is focused by the first convex lens onto the light blocking part of the light blocking layer and cannot be reflected, thereby implementing low reflectivity of the low reflection structure. Compared with an alternatively stacked structure formed by high refractivity materials and low refractivity materials in the related art, the low reflection structure in the embodiments of the present disclosure has lower reflectivity, and there is no selection effect on the light wave frequency by the stacked structure formed by the high and low refractivity materials, thereby implementing the requirement of both low reflectivity and high hue simultaneously.

DETAILED DESCRIPTION

Figure 1:
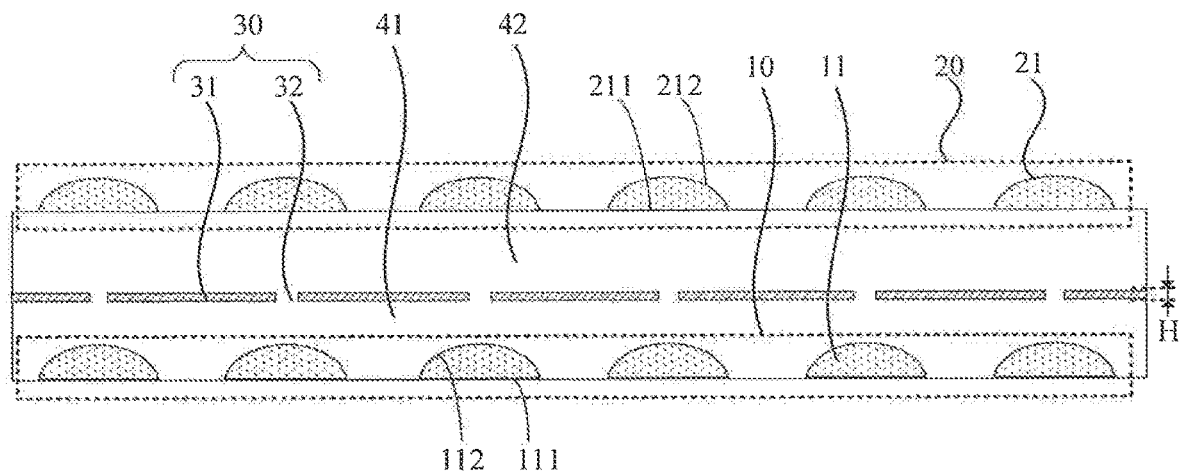
FIG. 1 is a sectional view of a low reflection structure according to an embodiment of the present disclosure.

Hereinafter the present disclosure will be further described in detail in conjunction with the drawings and embodiments. It is to be understood that the embodiments set forth herein are intended to explain the present disclosure and not to limit the present disclosure. Additionally, it is to be noted that for ease of description, merely part, not all, of the structures related to the present disclosure are illustrated in the drawings.

Figure 2:
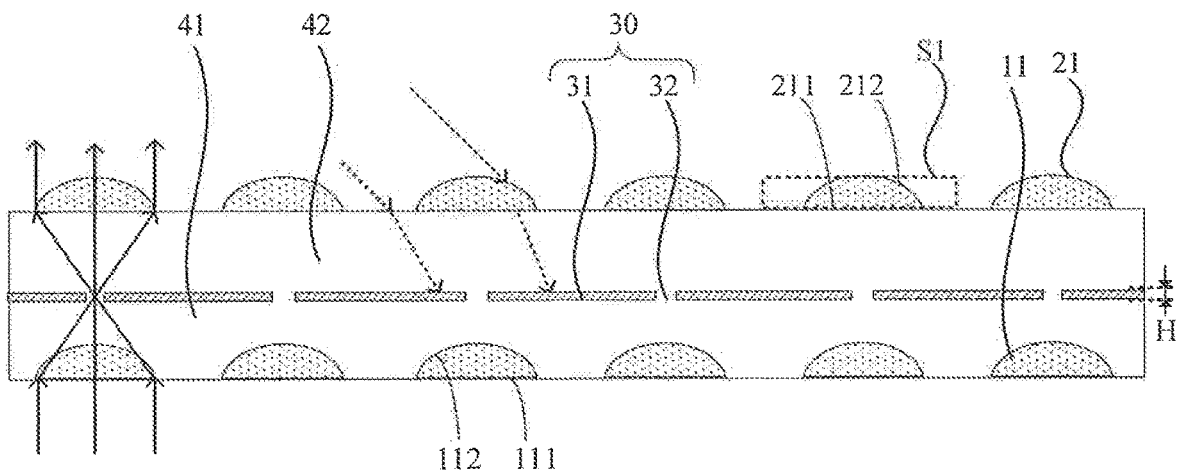
FIG. 2 is a light path diagram of the low reflection structure of FIG. 1.
Figure 3:
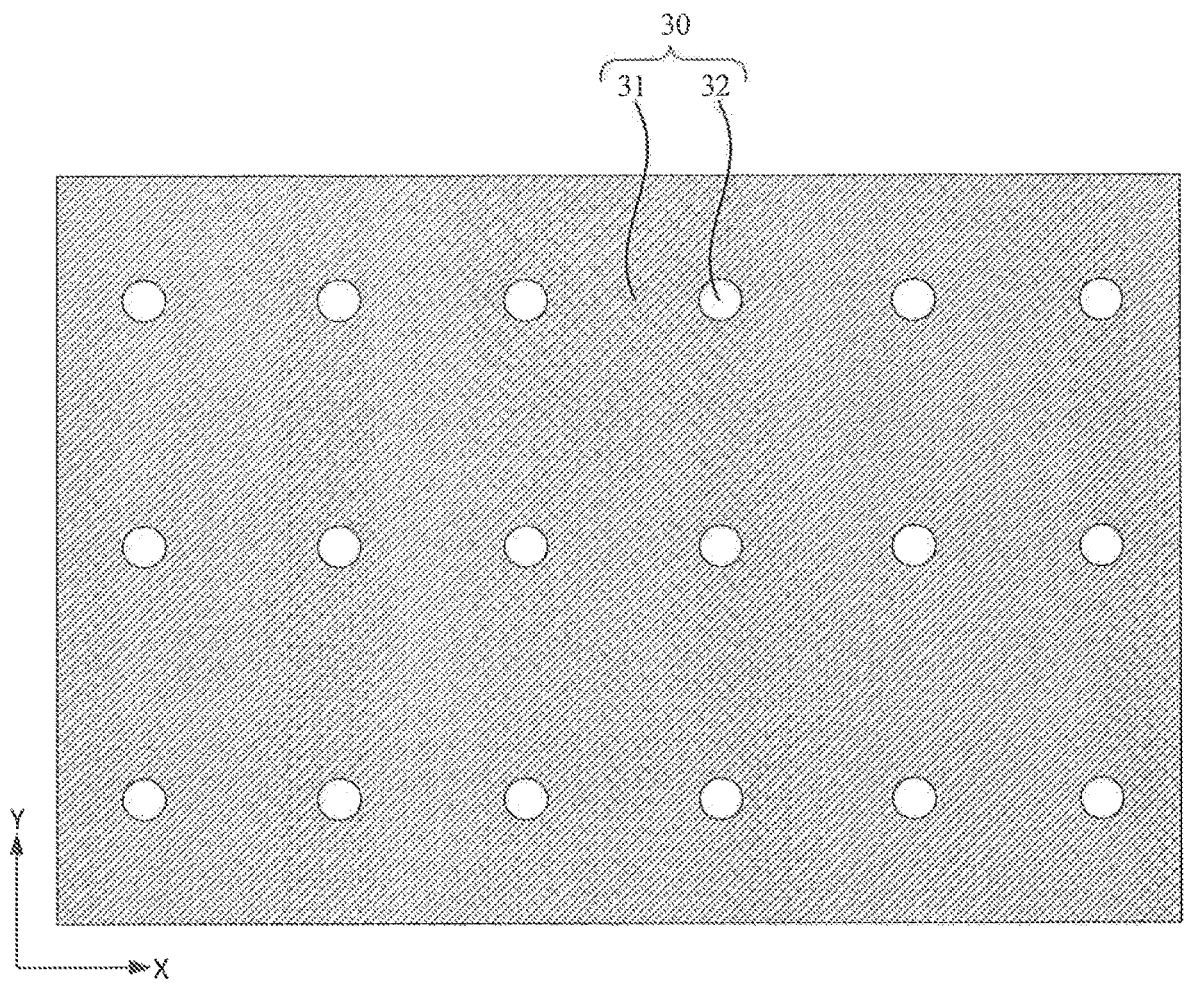
FIG. 3 is a top view of a light blocking layer in the low reflection structure of FIG. 1.

FIG. 1 is a sectional view of a low reflection structure according to an embodiment of the present disclosure. FIG. 2 is a light path diagram of the low reflection structure of FIG. 1. FIG. 3 is a top view of a light blocking layer in the low reflection structure of FIG. 1. Referring to FIG. 1, FIG. 2 and FIG. 3, the low reflection structure includes a first lens array 10, a second lens array 20, and a light blocking layer 30 located between the first lens array 10 and the second lens array 20. The first lens array 10 includes multiple first convex lenses 11. The second lens array 20 includes multiple second convex lenses 21. Each of the multiple first convex lenses 11 and the multiple second convex lenses 21 has a positive focal power. Each of the multiple first convex lenses 11 and the multiple second convex lenses 21 has a function of converging light. The light blocking layer 30 includes a light blocking part 31 and multiple light transmitting parts 32. The light blocking part 31 at least partially surrounds the multiple light transmitting parts 32. The light blocking part 31 has a function of absorbing light. Light projected to the light blocking part 31 is absorbed by the light blocking part 31, and thus, the light does not pass through the light blocking part 31 and is not reflected by the light blocking part 31. The light blocking part 31 may be a light absorbing material such as a black resin material, a three-dimensional mesoporous material or the like. Light projected to a light transmitting part 32 of the multiple light transmitting parts 32 may pass through the light transmitting part 32 and propagate from one side of the light blocking layer 30 to the other side of the light blocking layer 30. The light transmitting part 32 may be, for example, an opening or a light transmitting layer formed after the opening is filled with a low light absorbing medium. A focus of the first convex lens 11 is located within the light transmitting part 32.

Exemplarily, as shown in FIG. 2, since the focus of the first convex lens 11 is located within the light transmitting part 32, parallel light (indicated by solid line arrows in FIG. 2) vertically projected to the first convex lens 11 is focused within the light transmitting part 32, passes through the light transmitting part 32 and continuously propagate to the second convex lens 21. After passing through the second convex lens 21, the light becomes parallel light again and exits out of the low reflection structure. However, parallel light (indicated by dotted arrows in FIG. 2) obliquely incident to the second convex lens 21 is focused in the light blocking part 31 and thus absorbed by the light blocking part 31. The light cannot propagate to the side where the first convex lens 11 is located, or be reflected to the side where the second convex lens 21 is located. In a case where the low reflection structure is applied to a device such as a display panel, the first lens array 10 in the low reflection structure may be located between the second lens array 20 and a display box. Therefore, light emitted by the display box, as shown by solid line arrows in FIG. 2, can pass through the low reflection structure and exit out of the display panel, thus implementing a light emitting display. However, external ambient light, as shown by dotted arrows in FIG. 2, is not reflected by the low reflection structure, thus reducing the reflectivity to the external ambient light and improving the display effect. The case of applying the low reflection structure to the display panel is further described hereinafter. Each embodiment of the present disclosure is explained using parallel light as an example, and is not limit thereto.

In an embodiment, an image focal plane of the first convex lens 11 and an object plane of the second convex lens 21 are within a same plane. Specifically, referring to FIG. 2, the image focal plane of the first convex lens 11 is located on a side of the first convex lens 11 close to the second convex lens 21, and the object focal plane of the second convex lens 21 is located on a side of the second convex lens 21 close to the first convex lens 11. Because the image focal plane of first convex lens 11 and the object focal plane of second convex lens 21 are located with the same plane, the light that gets into first convex lens 11 perpendicularly can exit out perpendicularly finally, so that after applying to the display panel, and the colour mixture cannot happen to the light exited from adjacent second convex lens 21.

In this embodiment of the present disclosure, light from the side where the first lens array 10 is located is incident on the first convex lens 11 of the first lens array 10 at an inclined angle, so that the light is focused by the first convex lens 11 onto the light blocking part 31 of the light blocking layer 30 and cannot be reflected, thereby implementing low reflectivity of the low reflection structure. Compared with an alternatively stacked structure formed by high refractivity materials and low refractivity materials in the related art, the low reflection structure in this embodiment of the present disclosure has lower reflectivity, and there is no selection effect on the light wave frequency by the stacked structure formed by the high and low refractivity materials, thereby implementing a requirement for both low reflectivity and high hue simultaneously.

In an embodiment, referring to FIG. 3, the light blocking part 31 surrounds each of the multiple light transmitting parts 32 for a circle, and the multiple light transmitting parts 32 are arranged in an array along a first direction X and a second direction Y. The first direction X intersects the second direction Y. Since the multiple light transmitting parts 32 are arranged in the array along the first direction X and the second direction Y, the light blocking part 31 of the light blocking layer 30 can absorb, along the first direction X and/or the second direction Y, the light obliquely incident to the first lens array 10. In some embodiments, the first direction X and the second direction Y may be vertical to each other. In other embodiments, the first direction X and the second direction Y may not be vertical to each other, but have an included angle of a value between 0° and 90°.

In an embodiment, referring to FIG. 3, an area of the multiple light transmitting parts 32 is less than or equal to 10% of an area of the light blocking layer 30. That is, the area of all the multiple light transmitting parts 32 is less than or equal to 10% of the area of the entire light blocking layer 30, and the area of the light blocking part 31 is greater than 90% of the area of the entire light blocking layer 30. The multiple light transmitting parts 32 occupy a smaller area proportion in the light blocking layer 30, and the light blocking part 31 occupies a larger area proportion in the light blocking layer 30, so that the low reflection structure has relatively low reflectivity. To further reduce the area proportion of the multiple light transmitting parts 32 in the light blocking layer 30, in an embodiment, the area of the multiple light transmitting parts 32 is less than or equal to 5% of the area of the light blocking layer 30 to achieve a more preferred light absorbing effect and lower reflectivity. It can be seen that since the light incident from the side where the first lens array 10 is located is focused by the first convex lens 11 onto the light blocking part 31 of the light blocking layer 30 and cannot be reflected, the low reflection structure including the light blocking layer 30, the first lens array 10 and the second lens array 20 has lower reflectivity. That is, the low reflection structure is a structure that reduces the reflectivity of the light incident from the side where the first lens array 10 is located.

Figure 4:
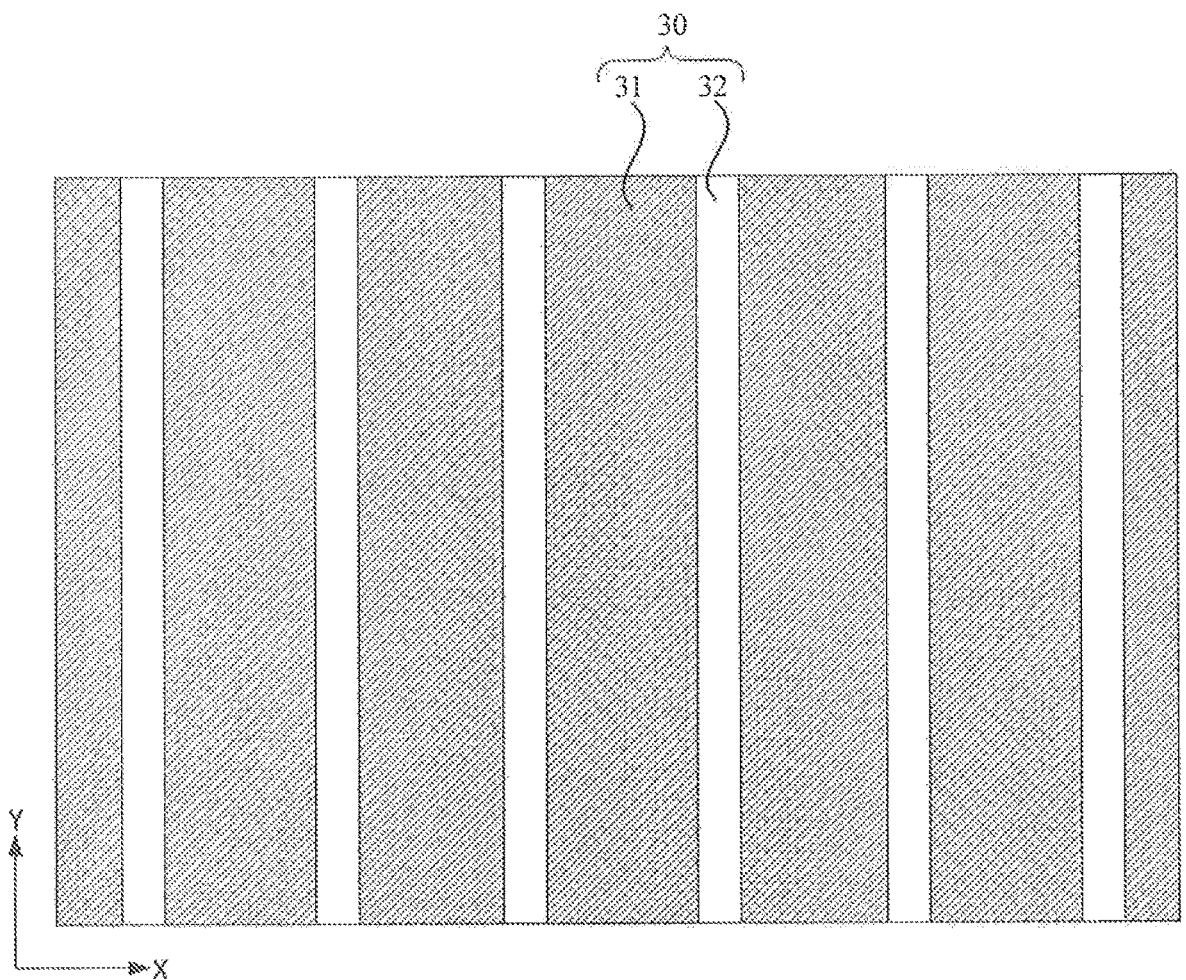
FIG. 4 is another top view of a light blocking layer in the low reflection structure of FIG. 1.

FIG. 4 is another top view of a light blocking layer in the low reflection structure of FIG. 1. Referring to FIG. 4, the multiple light transmitting parts 32 are formed as light transmitting strips. The light transmitting strips extend along the second direction Y and are arranged along the first direction X. The first direction X intersects the second direction Y. Since the light transmitting strips extend along the second direction Y and are arranged along the first direction X, the light blocking part 31 of the light blocking layer 30 can absorb, along the first direction, the light obliquely incident to the first lens array 10.

Figure 5:
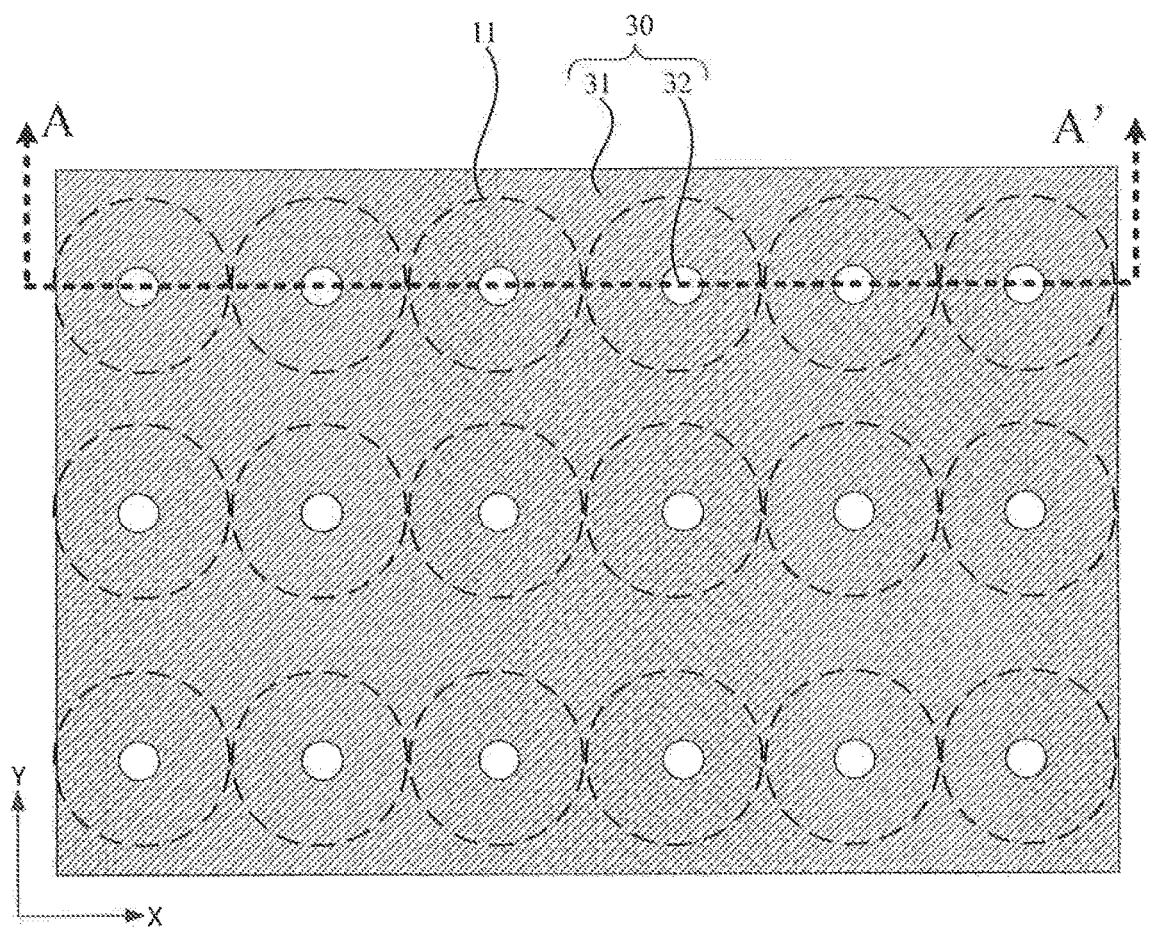
FIG. 5 is a top view of a low reflection structure according to an embodiment of the present disclosure.
Figure 6:
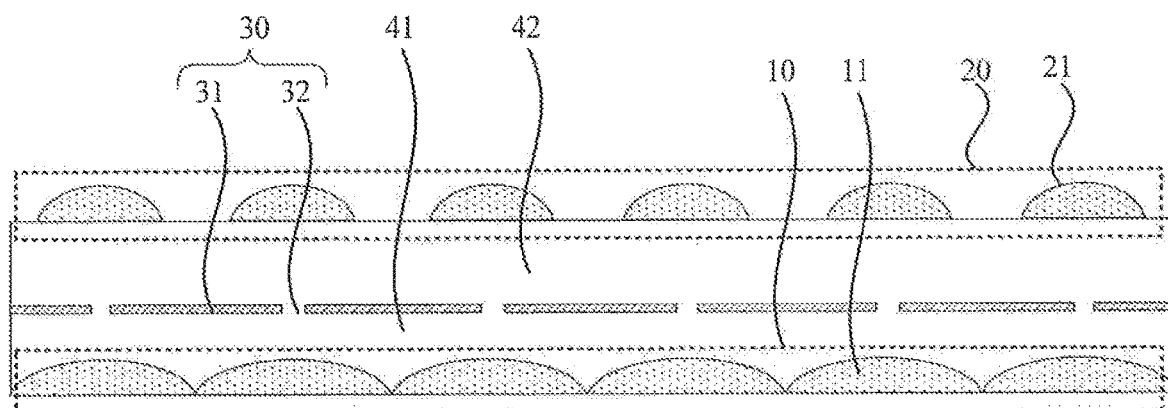
FIG. 6 is a sectional view of FIG. 5 along section line AA'.

FIG. 5 is a top view of a low reflection structure according to an embodiment of the present disclosure. FIG. 6 is a sectional view of FIG. 5 along section line AA'. Referring to FIG. 5 and FIG. 6, every two adjacent first convex lenses 11 are in contact with each other along a first direction X. Therefore, in a limited space, more first convex lenses 11 may be disposed along the first direction X, or a size of the first convex lens 11 is increased along the first direction X, thus reducing the process difficulty of manufacturing the first convex lens 11. It is to be understood that since multiple first convex lenses 11 are arranged in an array along the first direction X and the second direction Y, therefore, in other embodiments, it is also feasible to dispose every two adjacent first convex lenses 11 to be in contact with each other along the second direction Y, or dispose every two adjacent first convex lenses 11 to be in contact with each other along both the first direction X and the second direction Y.

Figure 7:
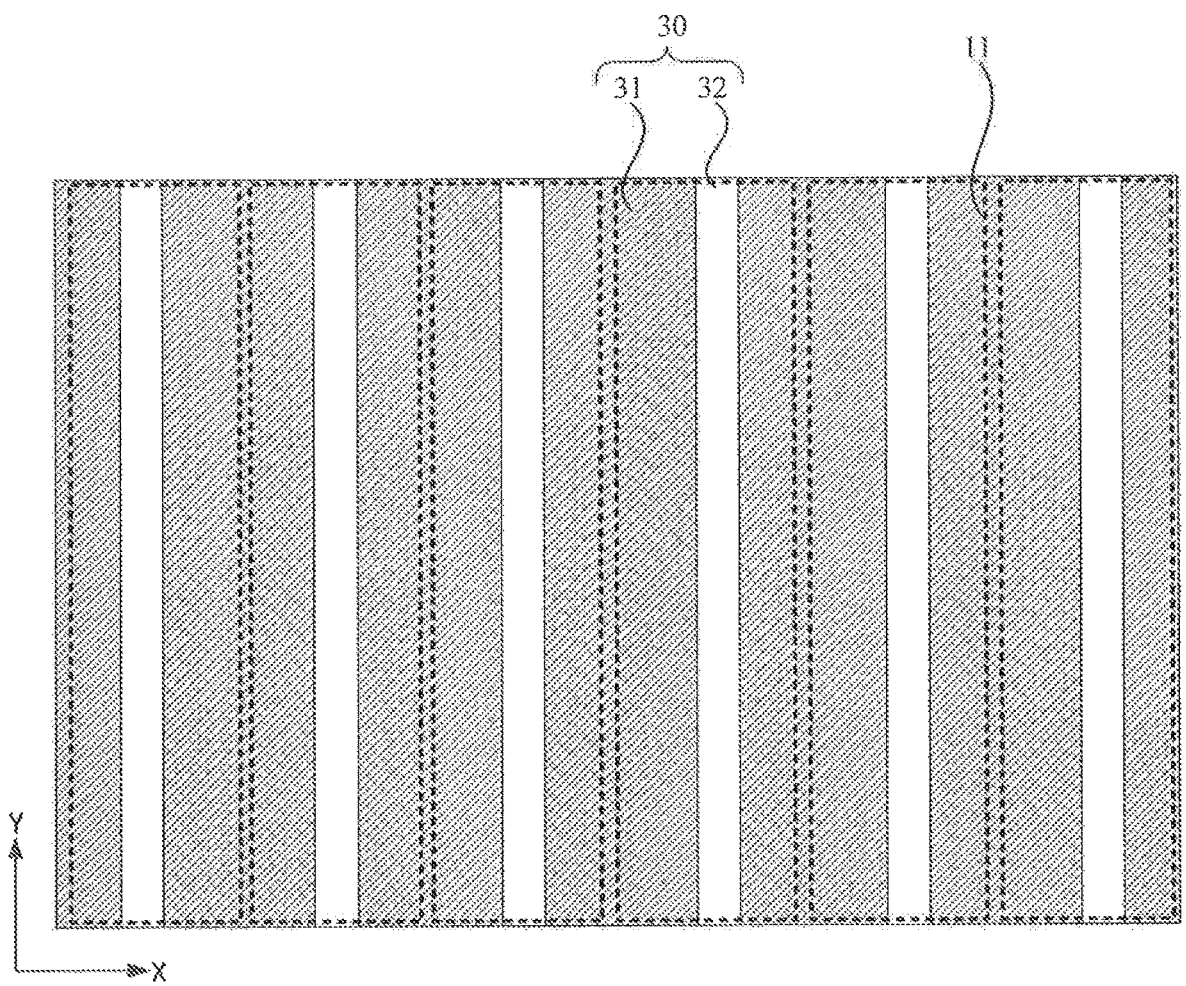
FIG. 7 is a top view of another low reflection structure according to an embodiment of the present disclosure.

FIG. 7 is a top view of another low reflection structure according to an embodiment of the present disclosure. Referring to FIG. 7, every two adjacent first convex lenses 11 are in contact with each other along a first direction X. Thereby, in a limited space, more first convex lenses 11 may be disposed along the first direction X, or the size of the first convex lens 11 is increased along the first direction X, thus reducing the process difficulty of manufacturing the first convex lenses 11. Exemplarily, as shown in FIG. 7, multiple first convex lenses 11 extend along a second direction Y and are arranged along the first direction X. The first convex lens 11 may be a semi-cylinder. Each first convex lens 11 overlaps one light transmitting strip. In other embodiments, the multiple first convex lenses 11 may be arranged in an array along the first direction X and the second direction Y, and each light transmitting strip overlaps multiple first convex lenses 11 along the second direction Y.

Exemplarily, referring to FIG. 2, region Si illustrates a repeated unit arranged along the first direction X. It may be regarded that the repeated unit includes a second convex lens 21 and air within the dotted line frame in FIG. 2 other than the second convex lens 21. Along a direction in which the second lens array 20 facing toward the first lens array 10, a proportion of the air in region Si becomes smaller and smaller, and a proportion of the second convex lens 21 becomes larger and larger, so equivalent refractivity of region Si becomes larger and larger, thus forming a moth-eye film reflection reducing structure and reducing the reflectivity of light incident to the second convex lens 21. Further, along the first direction X, the smaller a distance between two adjacent second convex lenses 21, the better the effect of reducing the reflectivity. Similarly, along the second direction Y, the smaller a distance between two adjacent second convex lenses 21, the better the effect of reducing the reflectivity.

Figure 8:
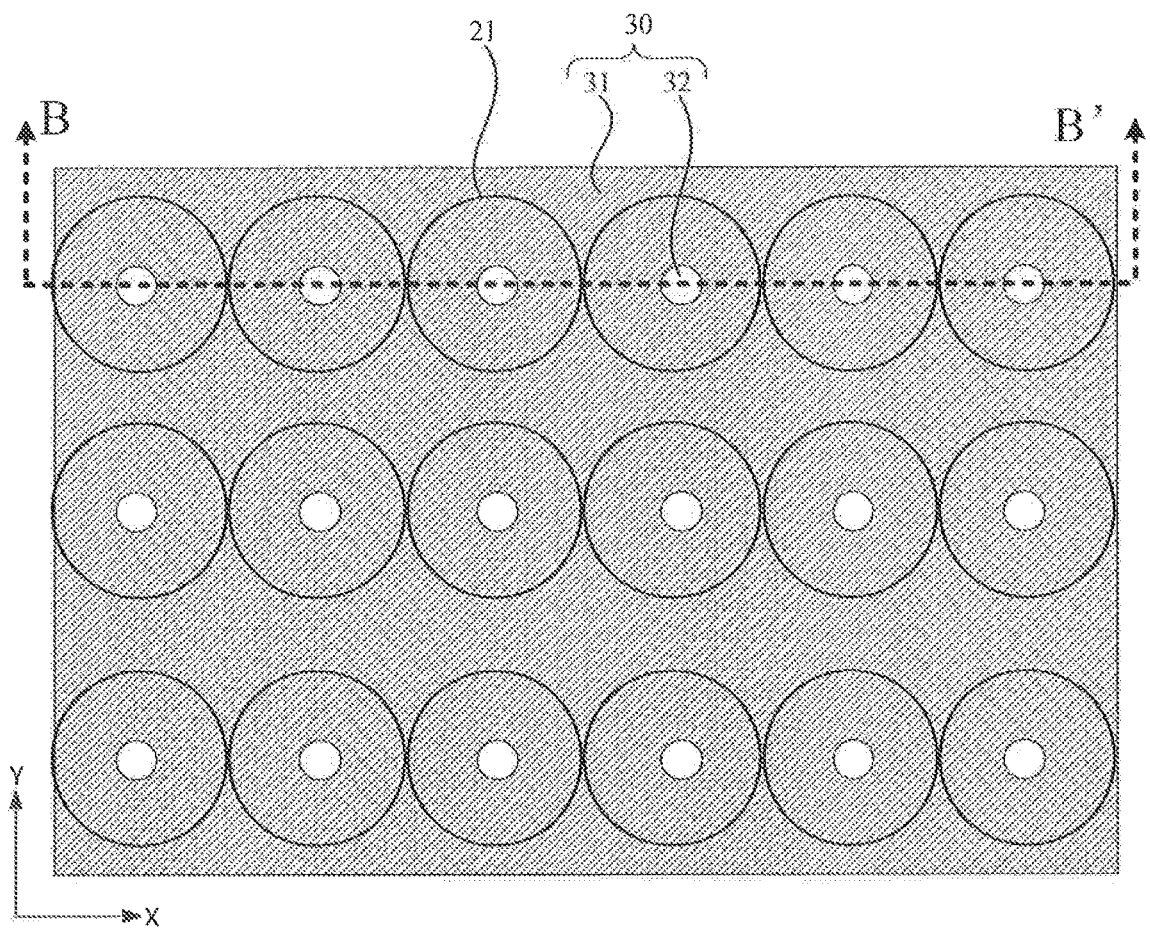
FIG. 8 is a top view of another low reflection structure according to an embodiment of the present disclosure.
Figure 9:
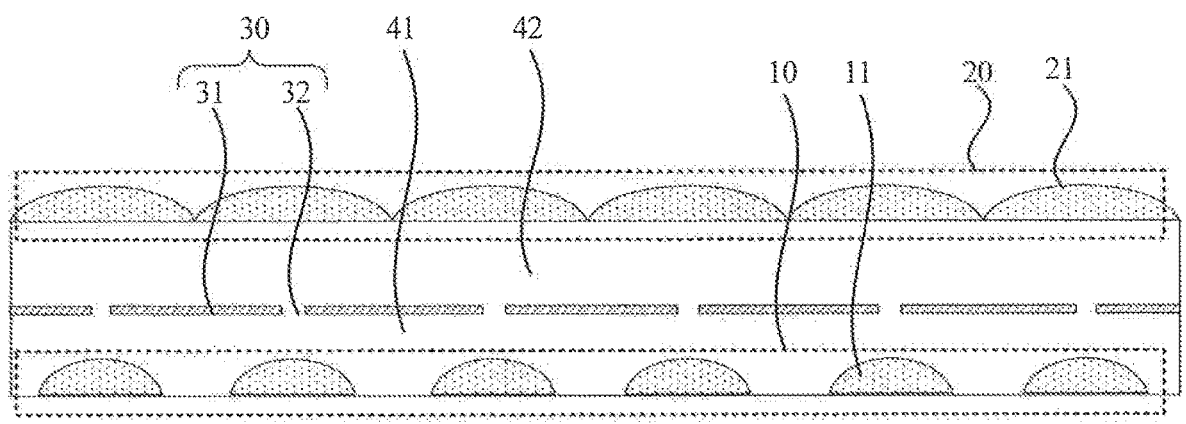
FIG. 9 is a sectional view of FIG. 8 along section line BB'.

FIG. 8 is a top view of another low reflection structure according to an embodiment of the present disclosure. FIG. 9 is a sectional view of FIG. 8 along section line BB'. Referring to FIG. 8 and FIG. 9, along the first direction X, two adjacent second convex lenses 21 are in contact with each other, thereby minimizing the distance between every two second convex lenses 21 along the first direction X and improving the effect of reducing the reflectivity. Additionally, in a limited space, more second convex lenses 21 may be disposed along the first direction X, or the size of a second convex lens 21 is increased along the first direction X, thus reducing the process difficulty of manufacturing the second convex lenses 21. It is to be understood that since multiple second convex lenses 21 are arranged in an array along the first direction X and a second direction Y, in other embodiments, it is also feasible to dispose every two adjacent second convex lenses 21 to be in contact with each other along the second direction Y, or dispose every two adjacent second convex lenses 11 to be in contact with each other along both the first direction X and the second direction Y.

Figure 10:
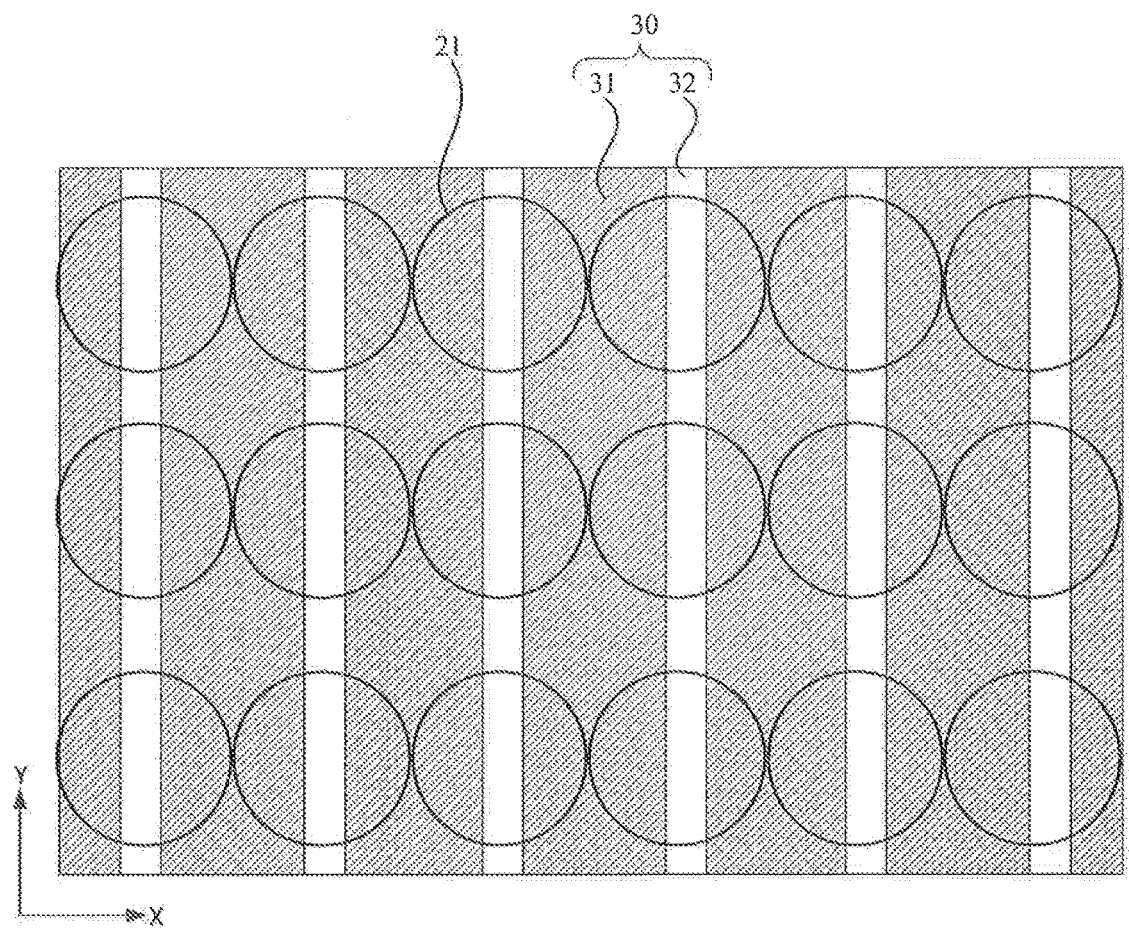
FIG. 10 is a top view of another low reflection structure according to an embodiment of the present disclosure.

FIG. 10 is a top view of another low reflection structure according to an embodiment of the present disclosure. Referring to FIG. 10, along the first direction X, every two adjacent second convex lenses 21 are in contact with each other, thereby minimizing the distance between every two second convex lenses 21 along the first direction X and improving the effect of reducing the reflectivity. Additionally, in a limited space, more second convex lenses 21 may be disposed along the first direction X, or the size of a second convex lens 21 is increased along the first direction X, thus reducing the process difficulty of manufacturing the second convex lenses 21. Exemplarily, as shown in FIG. 10, multiple second convex lenses 21 may be arranged in an array along the first direction X and the second direction Y, and each light transmitting strip overlaps multiple second convex lenses 21 along the second direction Y. The second convex lens 21 may be a semi-ellipsoid or a hemisphere. In other embodiments, multiple second convex lenses 21 extend along the second direction Y and are arranged along the first direction X. The second convex lens 21 may be a semi-cylinder. Each second convex lens 21 overlaps one light transmitting strip.

In an embodiment, the low reflection structure further includes a first dielectric layer 41 and a second dielectric layer 42. The first dielectric layer 41 is located between the light blocking layer 30 and the first lens array 10. The second dielectric layer 42 is located between the light blocking layer 30 and the second lens array 20. The first dielectric layer 41 is located between the first lens array 10 and the light blocking layer 30. The first dielectric layer 41 covers the uneven first lens array 10 and forms a flat surface on one side of the first dielectric layer 41 away from the first lens array 10. The second dielectric layer 42 is located between the second lens array 20 and the light blocking layer 30. One side of the second dielectric layer 42 adjacent to the light blocking layer 30 may be a flat surface, which is conductive to forming the light blocking layer 30 on the flat surface of the second dielectric layer 42. In other embodiments, the light blocking layer 30 may be formed on the flat surface of the first dielectric layer 41, which is not limited in the present disclosure.

In an embodiment, the refractivity of the first dielectric layer 41 is equal to the refractivity of the second dielectric layer 42. In a case where a light transmitting part 32 of the light blocking layer 30 is an opening, the first dielectric layer 41 and/or the second dielectric layer 42 fill the opening, and a boundary between the first dielectric layer 41 and the second dielectric layer 42 is formed at a position of the light transmitting part 32 of the light blocking layer 30. If the refractivity of the first dielectric layer 41 is not equal to the refractivity of the second dielectric layer 42, light is refracted at the boundary between the first dielectric layer 41 and the second dielectric layer 42, which is not conductive to simplifying the optical path design. Additionally, if the refractivity of the first dielectric layer 41 is not equal to the refractivity of the second dielectric layer 42, there is a certain degree of reflection at the boundary between the first dielectric layer 41 and the second dielectric layer 42. In this embodiment of the present disclosure, the refractivity of the first dielectric layer 41 is equal to the refractivity of the second dielectric layer 42, which is conductive to reducing or even avoiding the reflection at the boundary between the first dielectric layer 41 and the second dielectric layer 42 and simplifying the optical path design. Further, the first dielectric layer 41 and the second dielectric layer 42 may be formed by a same material, so that the first dielectric layer 41 and the second dielectric layer 42 have same refractivity. Since the first dielectric layer 41 and the second dielectric layer 42 may be formed by the same material, thereby reducing types of materials used in the manufacture of the low reflection structure and simplifying the manufacture process In an embodiment, still referring to FIG. 1 and FIG. 2, the first convex lens 11 includes a first surface 111 and a second surface 112. The second surface 112 is located between the first surface 111 and the first dielectric layer 41. The first surface 111 is a plane. The second surface 112 is a curved surface convex toward the first dielectric layer 41. The refractivity of the first convex lens 11 is greater than the refractivity of the first dielectric layer 41. The first surface 111 of the first convex lens 11 may be, for example, a part of a sphere or an ellipsoid. The first convex lens 11 is a planoconvex lens. Compared to a biconvex lens, the planoconvex lens has a simpler process and simpler manufacturing requirements.

Figure 11:
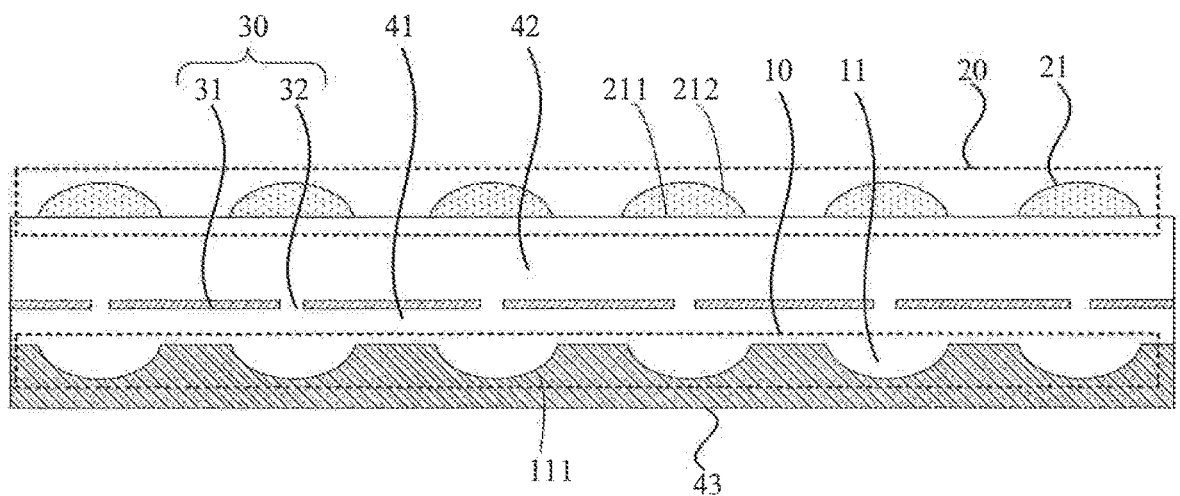
FIG. 11 is a sectional view of another low reflection structure according to an embodiment of the present disclosure.

FIG. 11 is a sectional view of another low reflection structure according to an embodiment of the present disclosure. Referring to FIG. 11, the low reflection structure further includes a third dielectric layer 43. The third dielectric layer 43 is located on one side of a first lens array 10 away from a light blocking layer 30. Multiple first convex lenses 11 are integrally formed with a first dielectric layer 41. That is, the multiple first convex lenses 11 and the first dielectric layer 41 that are in contact with each other are formed by a same material. A first convex lens 11 of the multiple first convex lenses 11 includes a first surface 111. The first surface 111 is a curved surface convex toward the third dielectric layer 43. The refractivity of the first convex lens 11 is greater than refractivity of the third dielectric layer 43.

Still referring to FIG. 1 and FIG. 2, the second convex lens 21 includes a third surface 211 and a fourth surface 212. The third surface 211 is located between the fourth surface 212 and the second dielectric layer 42. The third surface 211 is a plane. The fourth surface 212 is a curved surface convex away from the second dielectric layer 42. The third surface 211 of the second convex lens 21 may be, for example, a part of a sphere or an ellipsoid. The second convex lens 21 is a planoconvex lens. Compared to a biconvex lens, the planoconvex lens has a simpler process and simpler manufacturing requirements.

Figure 12:
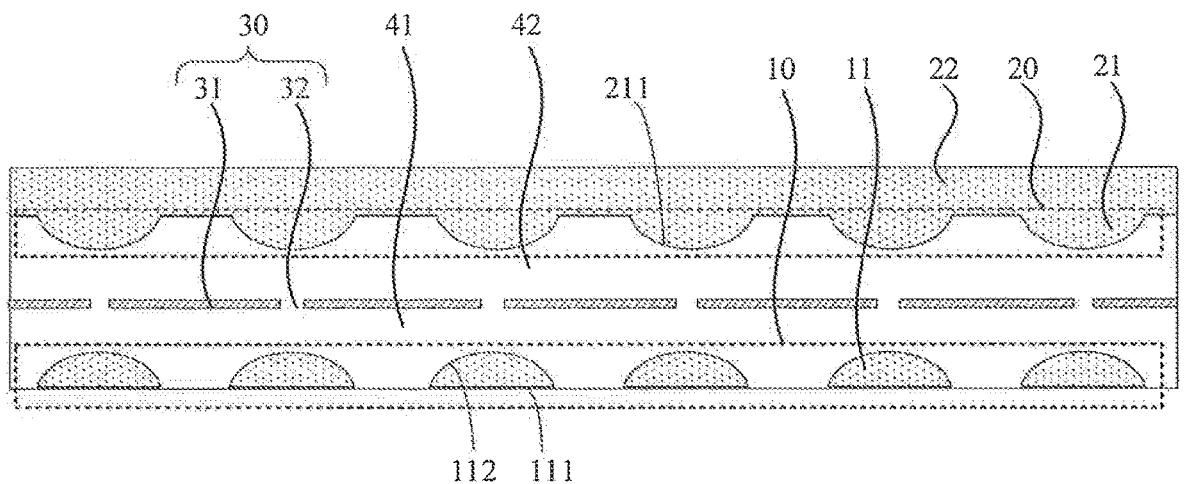
FIG. 12 is a sectional view of another low reflection structure according to an embodiment of the present disclosure.

FIG. 12 is a sectional view of another low reflection structure according to an embodiment of the present disclosure. Referring to FIG. 12, the low reflection structure further includes a second lens substrate 22. The second lens substrate 22 is located on one side of a second lens array 20 away from a light blocking layer 30. The second lens substrate 22 is integrally formed with multiple second convex lenses 21. That is, the second lens substrate 22 and the multiple second convex lenses 21 that are in contact with each other are formed by the same material. A second convex lens 21 of the multiple second convex lenses 21 includes a third surface 211. The third surface 211 is a curved surface convex toward the second dielectric layer 42. The refractivity of the second dielectric layer 42 is less than the refractivity of the second convex lens 21. In this embodiment of the present disclosure, the low reflection structure further includes the second lens substrate 22 that is integrally formed with the multiple second convex lenses 21, so the second lens substrate 22 and the multiple second convex lenses 21 may be formed in the same process without additional process steps. Moreover, the second lens substrate 22 is located on one side of the multiple second lenses 21 away from the second dielectric layer 42, thus preventing the second convex lens 21 from being in direct contact with external environment, and the second lens substrate 22 has a function of protecting the second convex lens 21.

In an embodiment, the second convex lens 21 and the first convex lens 11 have the same refractivity. Thus, in a case where each of the first convex lens 11 and the second convex lens 21 is a planoconvex lens, a curved surface of the first convex lens 11 and a curved surface of the second convex lens 21 may be designed to have a same shape, thereby simplifying the design process of the second convex lens 21 and the first convex lens 11. For example, a first lens array 10 and a second lens array 20 may be formed by using the same imprint mold or the same photomask. The second convex lens 21 may be formed from the same material as the first convex lens 11, so that the second convex lens 21 has the same refractivity as the first convex lens 11. Since the second convex lens 21 may be made of the same material as the first convex lens 11, types of materials used in the manufacture of the low reflection structure can be reduced, and the manufacture process is simplified.

In an embodiment, still referring to FIGS. 1 and 2, a thickness H of the light blocking layer 30 is greater than or equal to 1 nm and less than or equal to 10 µm along a direction vertical to the light blocking layer 30. If the thickness H of the light blocking layer 30 is less than 1 nm, the thickness H of the light blocking layer 30 is too small to fully absorb light incident to the light blocking part 31, thereby increasing the process difficulty. If the thickness H of the light blocking layer 30 is greater than 10 µm, the thickness H of the light blocking layer 30 is too large, thereby increasing the thickness of the low reflection structure and also increasing the thickness of a display panel using the low reflection structure, but the continuously increased thickness of the light blocking layer 30 is negligible for enhancing the light absorption performance. In this embodiment of the present disclosure, the thickness H of the light blocking layer 30 is greater than or equal to 1 nm and less than or equal to 10 µm. This not only ensures that the light blocking part 31 of the light blocking layer 30 has sufficient light absorbing capacity and ensures the feasibility of the process, but also enables the low reflection structure to have a smaller thickness. To further reduce the thickness of the low reflection structure, the thickness H of the light blocking layer 30 may be set greater than or equal to 1 nm and less than or equal to 5 µm.

In an embodiment, still referring to FIG. 1 and FIG. 2, on a direction vertical to the light blocking layer 30, a second convex lens 21 overlaps a first convex lens 11, and the multiple first convex lenses 11 and the multiple second convex lenses 21 are disposed correspondingly one by one. The first convex lens 11 and the second convex lens 21 are provided with a common optical axis. The optical axis of the first convex lens 11 and the second convex lens 21 passes through the light transmitting part 32. The focus of the first convex lens 11 and the focus of the second convex lens 21 each are located within the light transmitting part 32. The first convex lens 11 is disposed in confocal with the second convex lens 21. The first convex lens 11 and the second convex lens 21 may have a same focal length, and then, the first dielectric layer 41 and the second dielectric layer 42 may have a same thickness. The first convex lens 11 and the second convex lens 21 may have different focal lengths, and then, the first dielectric layer 41 and the second dielectric layer 42 may have different thicknesses. In other embodiments, each first convex lens 11 may correspond to multiple second convex lenses 21, which is not limited in this embodiment of the present disclosure.

Figure 13:
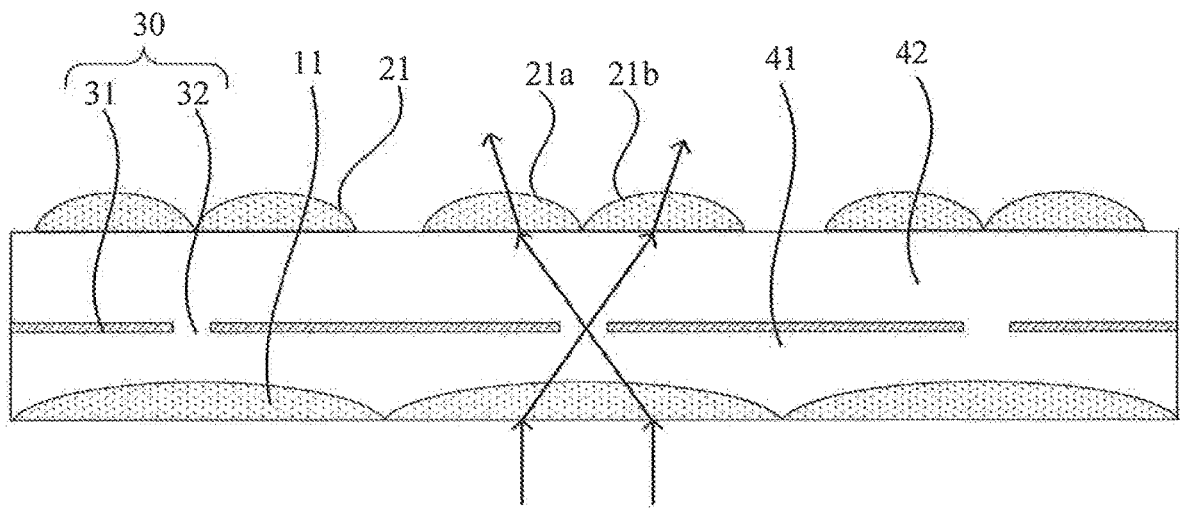
FIG. 13 is a sectional view of another low reflection structure according to an embodiment of the present disclosure.

FIG. 13 is a sectional view of another low reflection structure according to an embodiment of the present disclosure. Referring to FIG. 13, along a direction vertical to a light blocking layer 30, two adjacent second convex lenses 21 along a first direction X overlap one first convex lens 11. An optical axis of a first convex lens 11 passes through a light transmitting part 32. Optical axes of the two adjacent second convex lenses 21 are located on two sides of the optical axis of the first convex lens 11. In this embodiment of the present disclosure, for clarity, the two adjacent second convex lenses 21 are denoted as a left second convex lens 21a and a right second convex lens 21b. Parallel light projected to the first convex lens 11 is focused by the first convex lens 11 into the light transmitting part 32. Light passing through the left second convex lens 21a is inclined to the left, and thus, the light may be observed by an observer from a left side. Light passing through the right second convex lens 21b is inclined to the right, and thus, the light may be observed by the observer from a right side. Therefore, the low reflection structure provided by this embodiment of the present disclosure may be used to form a dual-view display. Due to a light blocking part 31 in the light blocking layer 30, most of the light projected from one side where the second convex lens 21 is located is absorbed by the light blocking part 31, so that low reflection can be implemented. Therefore, the low reflection structure in this embodiment of the present disclosure can implement low reflection and be used for a dual-view display.

Figure 14:
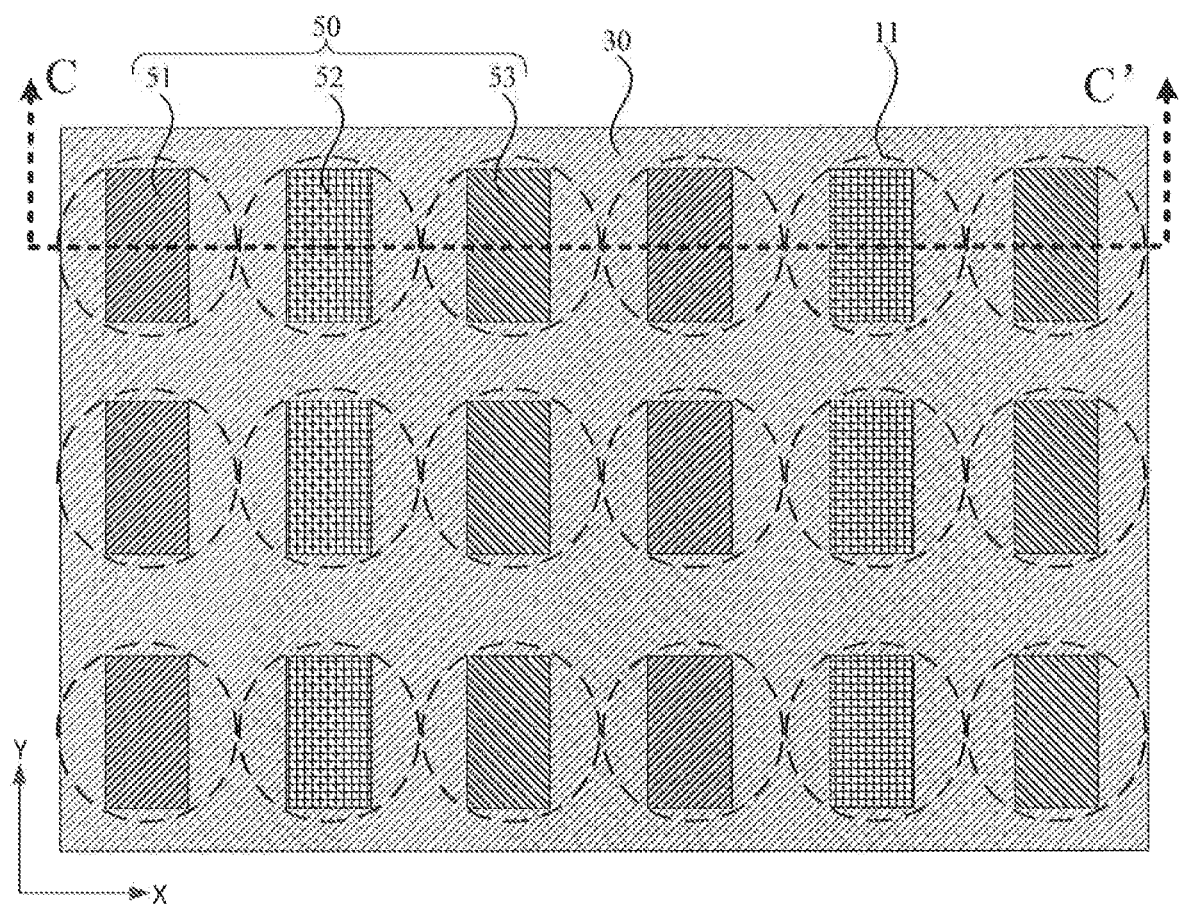
FIG. 14 is a top view of a display panel according to an embodiment of the present disclosure.
Figure 15:
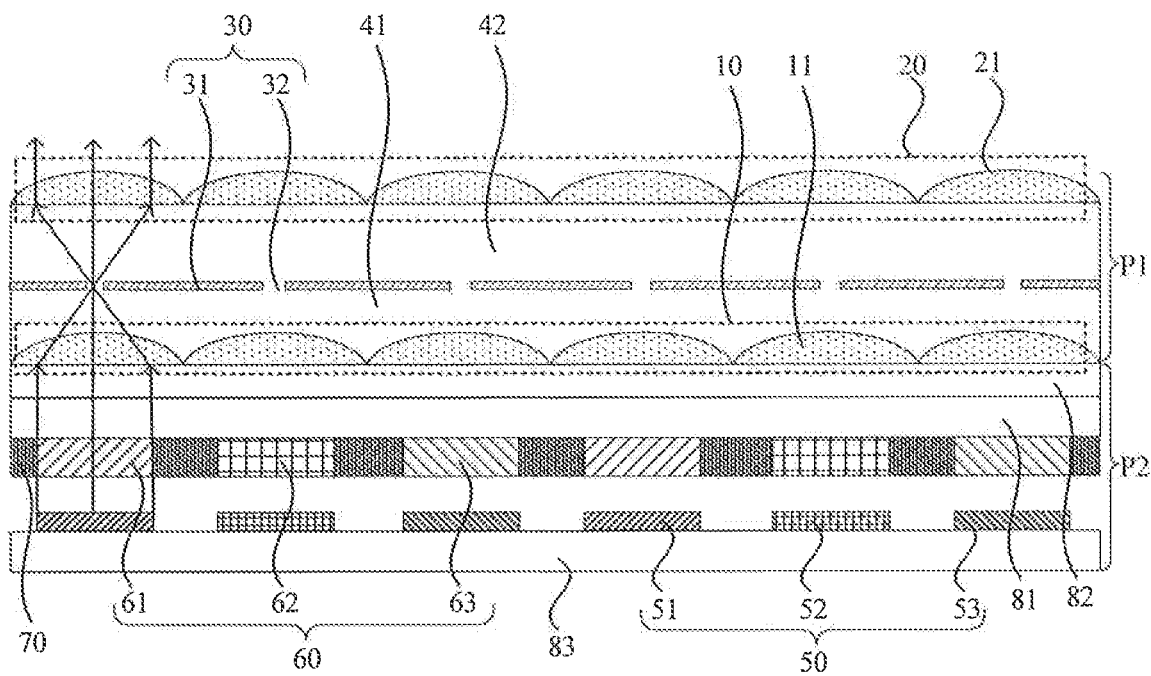
FIG. 15 is a sectional view of FIG. 14 along section line CC'.

An embodiment of the present disclosure further provides a display panel. FIG. 14 is a top view of a display panel according to an embodiment of the present disclosure. FIG. 15 is a sectional view of FIG. 14 along section line CC'. Referring to FIG. 14 and FIG. 15, the display panel includes a display box P2 and the low reflection structure P1 in the embodiments above. The low reflection structure P1 is located on a display side of the display box P2. Most of light emitted by the display box P2 is projected onto the low reflection structure P1 in a manner of parallel light, approximately parallel light or small-angle emitted light. Since a focus of a first convex lens 11 is located within a light transmitting part 32, parallel light vertically projected to the first convex lens 11 is focused into the light transmitting part 32, passes through the light transmitting part 32 and continuously to propagate to a second convex lens 21. After passing through the second convex lens 21, the light becomes parallel light again and is emitted, thereby implementing a normal light emitting display of the display panel. Most of external ambient light is projected onto the display panel obliquely at a large angle. Parallel light obliquely incident to the second convex lens 21 is focused in a light blocking part 31 and thus absorbed by the light blocking part 31. The light cannot propagate to a side where the first convex lens 11 is located, or be reflected to a side where the second convex lens 21 is located. Thereby, the external ambient light is not reflected by the low reflection structure, thus reducing the reflectivity to the external ambient light and improving the display effect.

In an embodiment, referring to FIG. 14 and FIG. 15, to illustrate the arrangement of sub-pixels in a pixel unit 50, the sub-pixels below a light blocking layer 30 are illustrated above the light blocking layer 30 in the top view. The display box P2 includes multiple pixel units 50. The pixel unit 50 includes multiple sub-pixels of different light emitting colors arranged along a first direction X. In this embodiment of the present disclosure, the pixel unit 50 is a basic display unit of the display box P2, and multiple different colors of light emitted by the multiple sub-pixels in the pixel unit 50 jointly synthesize a light emitting color and a light emitting brightness of the pixel unit 50. In other embodiments, each pixel unit 50 may further include multiple basic display units, or the function of the multiple pixel units 50 is equivalent to one basic display unit. Along the first direction X, each first convex lens 11 covers m sub-pixels, where 1≤m≤3. The greater the number of sub-pixels covered by the first convex lens 11 along the first direction X, the larger the size of the first convex lens 11 along the first direction X, the higher a requirement for the refractivity of the first convex lens 11. Moreover, the farther a sub-pixel is from an optical axis of the first convex lens 11, the more difficult it is to control the light emitting of the sub-pixel. Therefore, the size of the first convex lens 11 along the first direction X cannot be set too large. It has been found that in the case where the first convex lens 11 covers 1 to 3 sub-pixels along the first direction X, it is easier to meet the requirement for the refractivity of the first convex lens 11, and the first convex lens 11 has good light emitting control capability for each sub-pixel covered by the first convex lens 11.

Exemplarily, referring to FIGS. 14 and 15, the pixel unit 50 includes a first sub-pixel 51, a second sub-pixel 52 and a third sub-pixel 53. Any two of the first sub-pixel 51, the second sub-pixel 52 and the third sub-pixel 53 have different light emitting colors. For example, the first sub-pixel 51 emits red light, the second sub-pixel 52 emits green light, and the third sub-pixel 53 emits blue light, which is certainly not limited thereto. In other embodiments, the first sub-pixel 51 may emit green light, the second sub-pixel 52 emits red light, and the third sub-pixel 53 emits blue light. Multiple first convex lenses 11 are arranged in an array along the first direction X and a second direction Y. The multiple pixel units 50 are arranged in an array along the first direction X and the second direction Y. Along the first direction X, each first convex lens 11 covers one sub-pixel. Along the second direction Y, each first convex lens 11 covers one sub-pixel.

Figure 16:
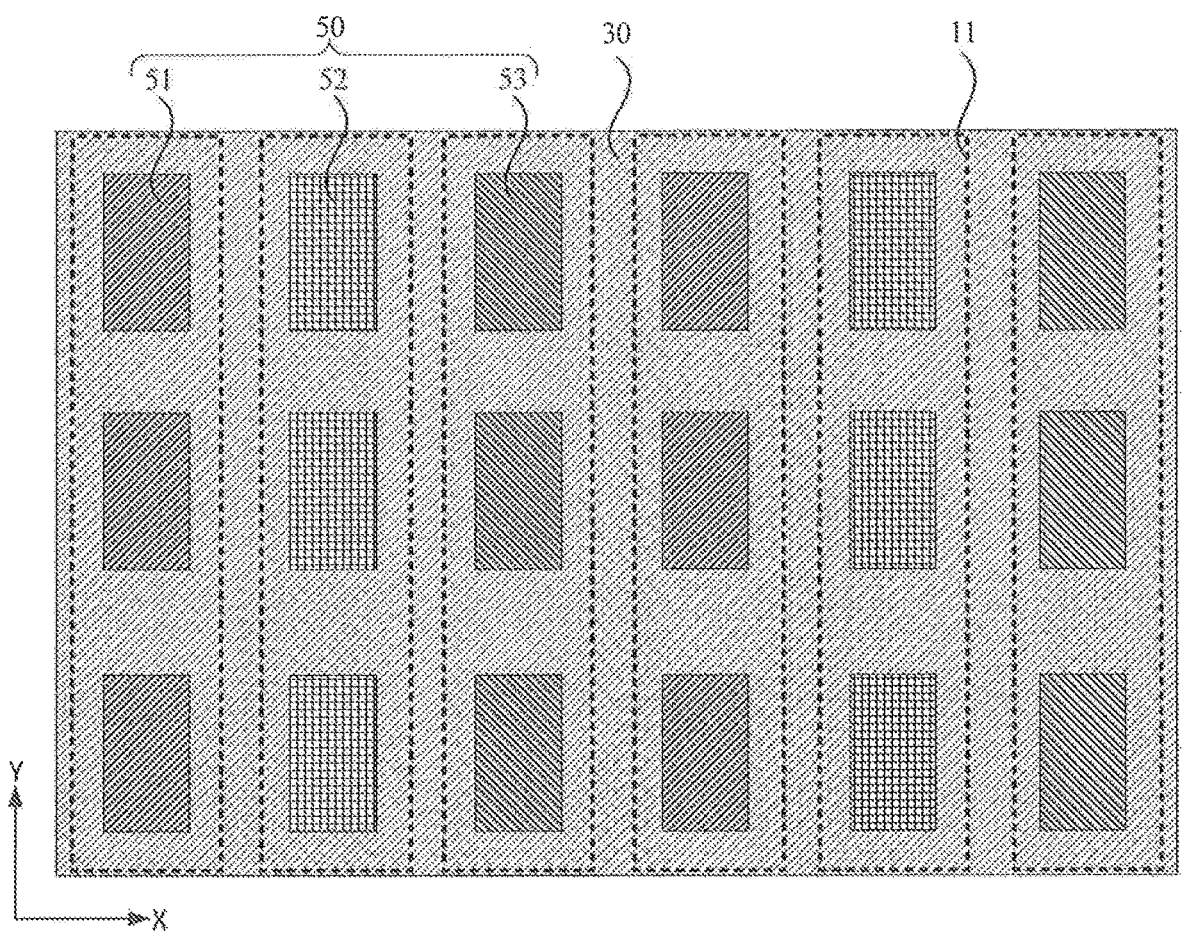
FIG. 16 is a top view of another display panel according to an embodiment of the present disclosure.

FIG. 16 is a top view of another display panel according to an embodiment of the present disclosure. Referring to FIG. 16, multiple first convex lens 11 extend along a second direction Y and are arranged along a first direction X, and multiple pixel units 50 extend along the first direction X and are arranged along the second direction Y. Along the first direction X, each first convex lens covers one sub-pixel. Along the second direction Y, each first convex lens 11 covers multiple sub-pixels.

Exemplarily, referring to FIG. 14 and FIG. 15, a first sub-pixel 51, a second sub-pixel 52 and a third sub-pixel 53 are sequentially arranged along the first direction X in the same pixel unit 50. Along the second direction Y, multiple first sub-pixels 51 are arranged in a column, multiple second sub-pixels 52 are arranged in a column, and multiple third sub-pixels 53 are arranged in a column. In other embodiments, multiple sub-pixels may have other arrangements. For example, in an embodiment, the first sub-pixel 51, the second sub-pixel 52 and the third sub-pixel 53 are sequentially arranged along the first direction X in the same pixel unit 50. Multiple sub-pixels arranged along the second direction Y may include multiple sub-pixels of different colors, for example, a first sub-pixel 51, a second sub-pixel 52, a third sub-pixel 53, a first sub-pixel 51, a second sub-pixel 52, a third sub-pixel 53 and the like arranged along the second direction Y. In another embodiment, the first sub-pixel 51, the second sub-pixel 52 and the third sub-pixel 53 in the same pixel unit 50 may be arranged in a delta shape. The arrangement of pixels is not limited in the present disclosure.

Figure 17:
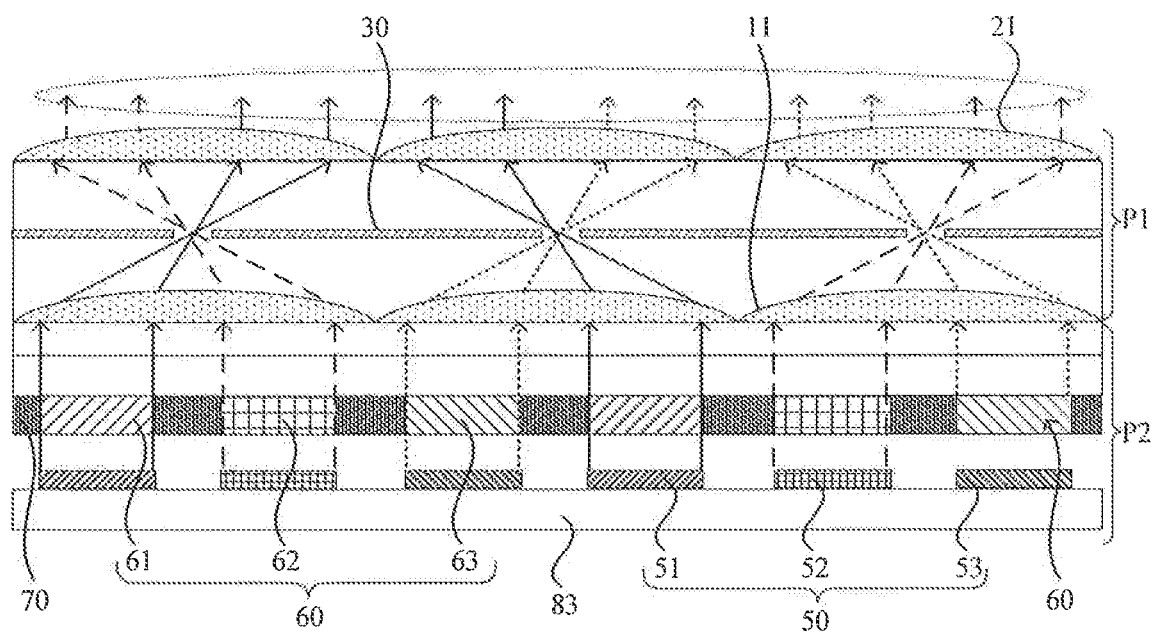
FIG. 17 is a sectional view of another display panel according to an embodiment of the present disclosure.

FIG. 17 is a sectional view of another display panel according to an embodiment of the present disclosure. Referring to FIG. 17, a pixel unit 50 includes a first sub-pixel 51, a second sub-pixel 52 and a third sub-pixel 53 arranged along a first direction X. Any two of the first sub-pixel 51, the second sub-pixel 52 and the third sub-pixel 53 have different light emitting colors. Sub-pixels of two adjacent pixel units 50 are arranged in the following manner: a first sub-pixel 51, a second sub-pixel 52, a third sub-pixel 53, a first sub-pixel 51, a second sub-pixel 52 and a third sub-pixel 53. Then, the first sub-pixels 51 of the two adjacent pixel units 50 emit light of the same color, and the light has adjacent positions after emitted from the low reflection structure P1. Similarly, the second sub-pixels 52 of the two adjacent pixel units 50 emit light of the same color and the light has adjacent positions after emitted from the low reflection structure P1, and the third sub-pixels 53 of the two adjacent pixel units 50 emit light of the same color and the light has adjacent positions after emitted from the low reflection structure P1. So that the display effect of the two pixel units 50 is equivalent to the display effect of one pixel unit 50, and the resolution of the display panel needs to be further optimized and improved.

Figure 18:
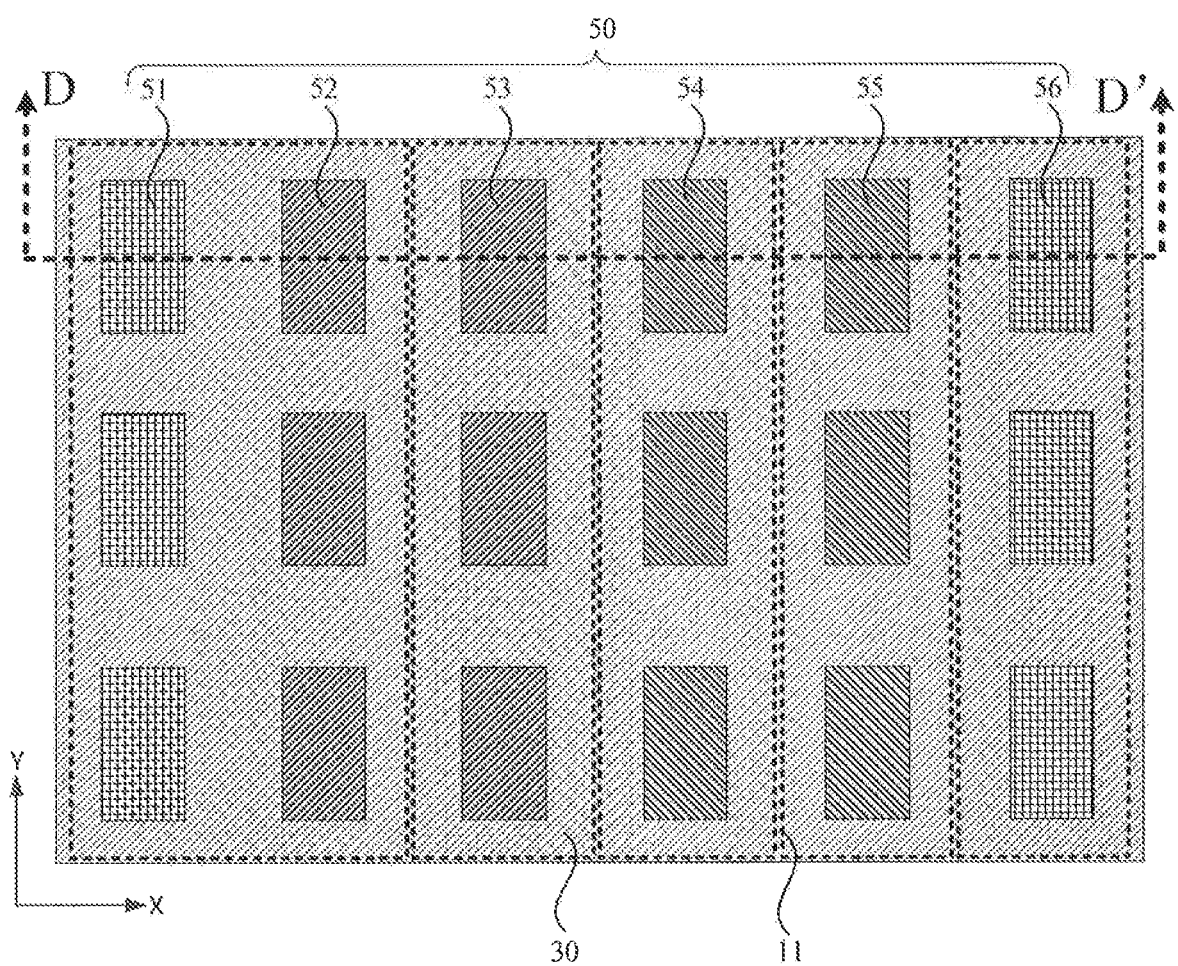
FIG. 18 is a top view of another display panel according to an embodiment of the present disclosure.
Figure 19:
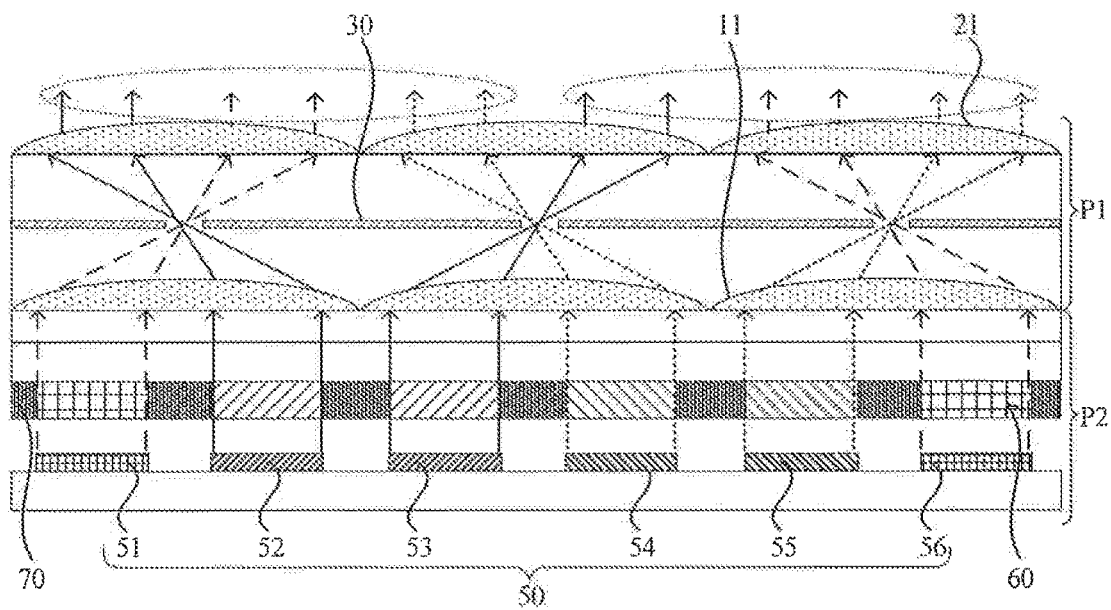
FIG. 19 is a sectional view of FIG. 18 along section line DD'.

FIG. 18 is a top view of another display panel according to an embodiment of the present disclosure. FIG. 19 is a sectional view of FIG. 18 along section line DD'. Referring to FIG. 18 and FIG. 19, a pixel unit 50 includes a first sub-pixel 51, a second sub-pixel 52, a third sub-pixel 53, a fourth sub-pixel 54, a fifth sub-pixel 55 and a sixth sub-pixel 56 sequentially arranged along a first direction X. The first sub-pixel 51 and the sixth sub-pixel 56 have a first light emitting color. The second sub-pixel 52 and the third sub-pixel 53 have a second light emitting color. The fourth sub-pixel 54 and the fifth sub-pixel 55 have a third light emitting color. Along the first direction X, each first convex lens 11 covers two sub-pixels, and two sub-pixels covered by the same first convex lens have different light emitting colors. For example, the first sub-pixel 51 and the second sub-pixel 52 are covered by the same first convex lens 11, the third sub-pixel 53 and the fourth sub-pixel 54 are covered by the same first convex lens 11, and the fifth sub-pixel 55 and the sixth sub-pixel 56 are covered by the same first convex lens 11. In this embodiment of the present disclosure, along the first direction X, light emitted from the low reflection structure P1 is sequentially light emitted from the second sub-pixel 52, light emitted from the first sub-pixel 51, light emitted from the fourth sub-pixel 54, light emitted from the third sub-pixel 53, light emitted from the sixth sub-pixel 56, and light emitted from the fifth sub-pixel 55. Any two of the second sub-pixel 52, the first sub-pixel 51 and the fourth sub-pixel 54 have different light emitting colors. Any two of the third sub-pixel 53, the sixth sub-pixel 56 and the fifth sub-pixel 55 have different light emitting colors. Thus, the display effect of one pixel unit 50 is equivalent to the display effect of two basic display units. Each basic display unit corresponds to three sub-pixels. This improves the resolution of the display panel.

Exemplarily, in other embodiments, in the case where each first convex lens 11 covers two sub-pixels along the first direction X, each first convex lens 11 may overlap two second convex lenses 21, and each second convex lens 21 may overlap sub-pixels correspondingly one by one, thereby implementing a dual-view display.

Figure 20:
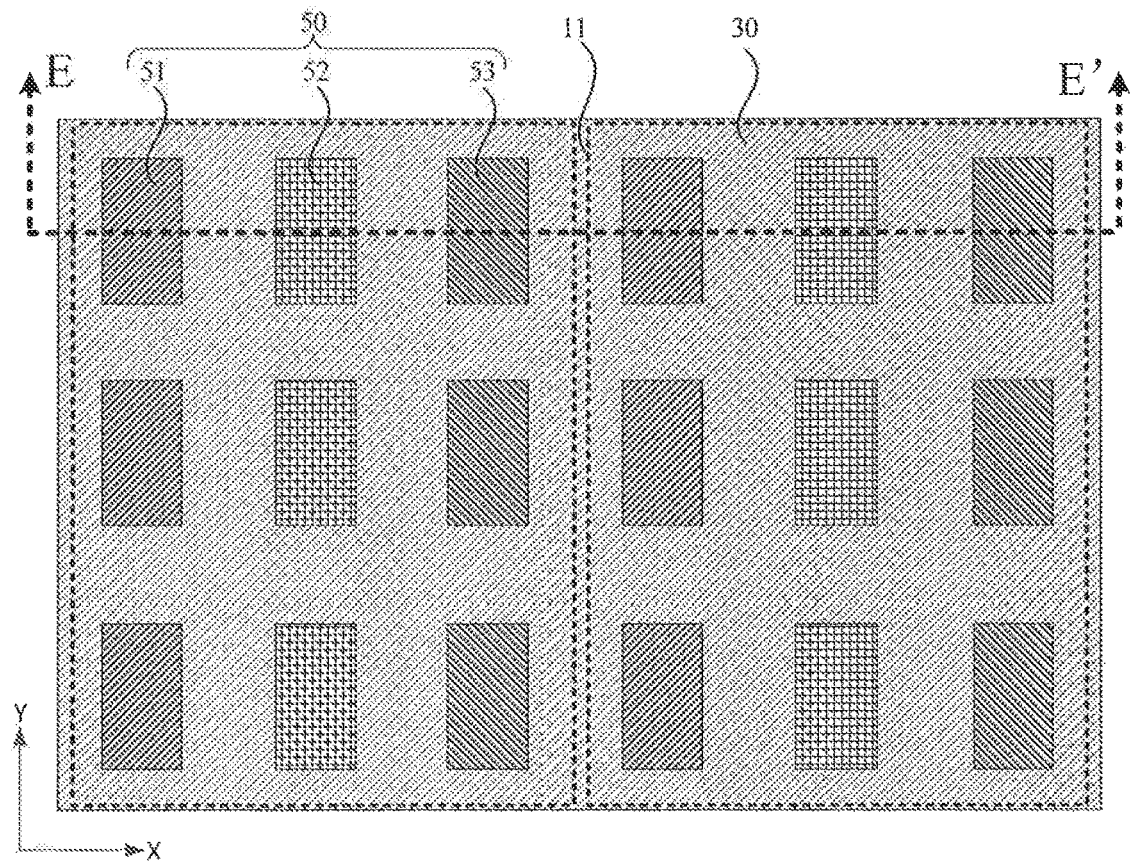
FIG. 20 is a top view of another display panel according to an embodiment of the present disclosure.
Figure 21:
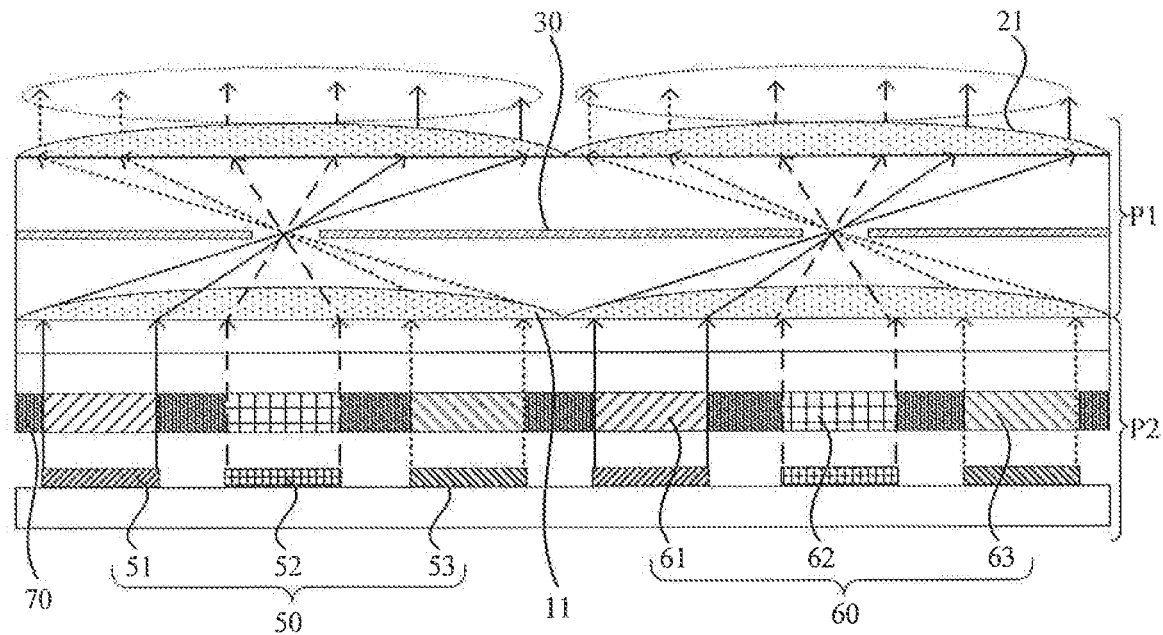
FIG. 21 is a sectional view of FIG. 20 along section line EE'.

FIG. 20 is a sectional view of another display panel according to an embodiment of the present disclosure. FIG. 21 is a sectional view of FIG. 20 along section line EE'. Referring to FIG. 20 and FIG. 21, a pixel unit 50 includes a first sub-pixel 51, a second sub-pixel 52 and a third sub-pixel 53 sequentially arranged along a first direction X. Any two of the first sub-pixel 51, the second sub-pixel 52 and the third sub-pixel 53 have different light emitting colors. Sub-pixels of two adjacent pixel units 50 are arranged in the following manner: a first sub-pixel 51, a second sub-pixel 52, a third sub-pixel 53, a first sub-pixel 51, a second sub-pixel 52 and a third sub-pixel 53. Along the first direction X, each first convex lens 11 covers three sub-pixels, and the three sub-pixels covered by each first convex lens have different light emitting colors. Along a first direction X, light emitted from the low reflection structure P1 is sequentially light emitted from the third sub-pixel 53, light emitted from the second sub-pixel 52, light emitted from the first sub-pixel 51, light emitted from the sixth sub-pixel 56, light emitted from the fifth sub-pixel 55, and light emitted from the fourth sub-pixel 54. Any two of the third sub-pixel 53, the second sub-pixel 52 and the first sub-pixel 51 have different light emitting colors. Any two of the sixth sub-pixel 56, the fifth sub-pixel 55 and the fourth sub-pixel 54 have different light emitting colors. Thus, the display effect of one pixel unit 50 is equivalent to the display effect of one basic display unit, and the resolution of the display panel is not reduced.

In an embodiment, referring to FIG. 14 to FIG. 21, the display box P2 includes multiple pixel units 50, a color film substrate 81 and multiple color resists 60. The pixel unit 50 includes multiple sub-pixels of different light emitting colors arranged along the first direction X. The multiple color resists 60 are located between the color film substrate 81 and the multiple pixel units 50. Along a direction vertical to the color film substrate 81, the multiple color resist 60 sub-pixels overlap correspondingly one by one. The low reflection structure P1 is located on one side of the color film substrate 81 away from the multiple pixel units 50. In this embodiment of the present disclosure, the display panel may be a liquid crystal display panel, and the low reflection structure P1 is located on the outer side of the color film substrate 81, thereby reducing the reflectivity of external ambient light irradiated to the display panel.

Exemplarily, referring to FIG. 14, the display box P2 may further include an array substrate 83, a black matrix 70 and a line polarizer 82. The array substrate 83 is located on one side of the multiple pixel units 50 away from the color film substrate 81, and the multiple pixel units 50 are disposed on the array substrate 83. Along the first direction X, the black matrix 70 is spaced between two adjacent sub-pixels. The multiple color resists 60 may include a first color resist 61, a second color resist 62 and a third color resist 63. Any two of the first color resist 61, the second color resist 62 and the third color resist 63 have different light transmitting colors. A light transmitting color refers to the color of light after the light passes through a color resist 60. The first sub-pixel 51 overlaps the first color resist 61. The second sub-pixel 52 overlaps the second color resist 62. The third sub-pixel 53 overlaps the third color resist 63. Thus, light projected from the first sub-pixel 51 to the first color resist 61 is filtered by the first color resist 61 and presented as a first light emitting color, light projected from the second sub-pixel 52 to the second color resist 62 is filtered by the second color resist 62 and presented as a second light emitting color, and light projected from the third sub-pixel 53 to the third color resist 63 is filtered by the third color resist 63 and presented as a third light emitting color. Therefore, in the case where the display panel is a liquid crystal display panel, the light emitting color of the sub-pixel refers to the color of light after projected by the sub-pixel to the color resist 60 that overlaps the sub-pixel. This is well known in the field of display technologies and is not repeated here. The linear polarizer 82 is located between the color film substrate 81 and the low reflection structure P1. In other embodiments, the low reflection structure P1 may be disposed between the linear polarizer 82 and the color film substrate 81.

In an embodiment, the display panel is a liquid crystal display panel, and the structure of the sub-pixel in the pixel unit 50 may include a well-known structure such as a common electrode and a pixel electrode.

Figure 22:
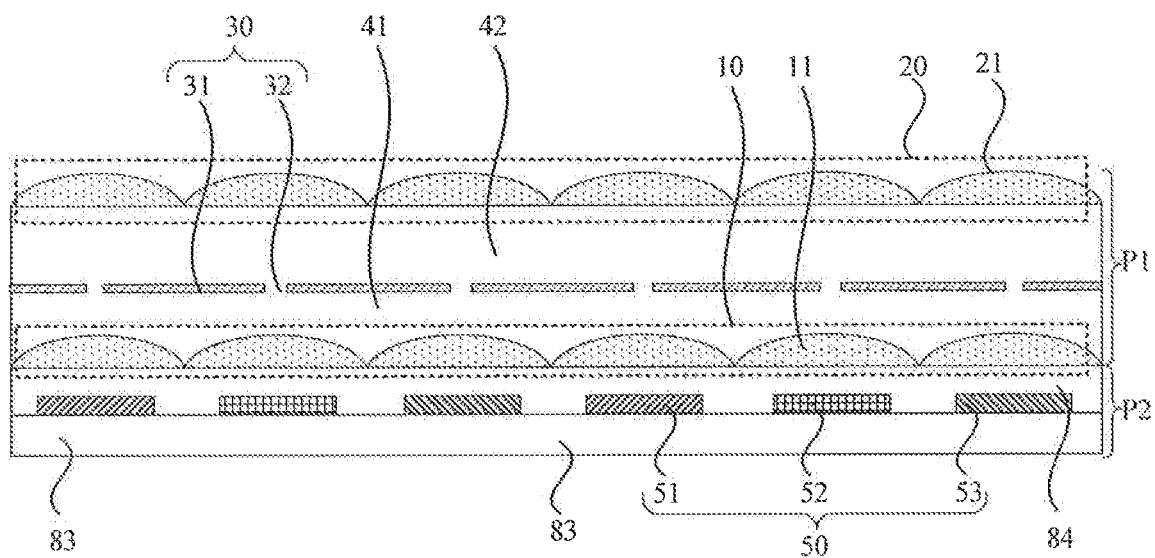
FIG. 22 is a sectional view of another display panel according to an embodiment of the present disclosure.

FIG. 22 is a sectional view of another display panel according to an embodiment of the present disclosure. Referring to FIG. 22, a display box P2 includes multiple pixel units 50 and a film packaging layer 84. The film packaging layer 84 is located on a display side of the multiple pixel units 50 and on one side of the multiple pixel units 50 away from the array substrate 83. The film packaging layer 84 may include, for example, an organic insulating layer and an inorganic insulating layer disposed in a staked manner, so as to prevent external water vapor and oxygen from eroding the multiple pixel units 50, thereby helping to improve the service life of the display panel. A pixel unit 50 of the multiple pixel units 50 includes an organic light emitting material layer. The organic light emitting material layer is a self-light emitting material. Therefore, in this embodiment of the present disclosure, the light emitting color of a sub-pixel refers to the color of the sub-pixel when the sub-pixel emits light. The low reflection structure P1 is located on one side of the color film substrate 84 away from the multiple pixel units 50. In this embodiment of the present disclosure, the display panel may be a liquid crystal display panel, and the low reflection structure P1 is located on the outer side of the color film substrate 84, thereby reducing the reflectivity of external ambient light irradiated to the display panel. In other embodiments, the display panel may further be a micro-LED display panel, an electrophoretic display panel or the like.

Figure 23:
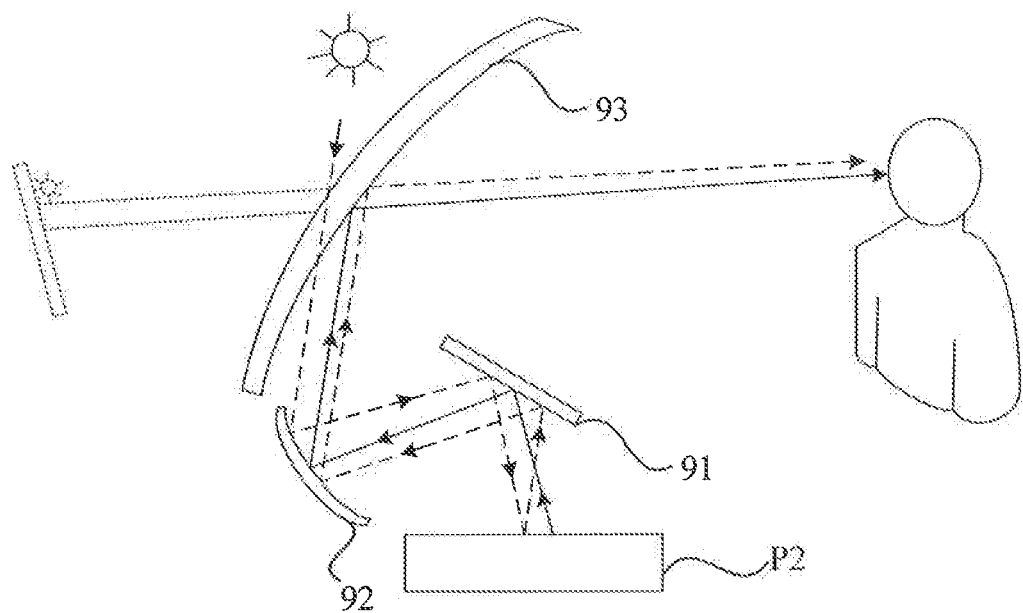
FIG. 23 is a light path diagram of a display device according to the related art.
Figure 24:
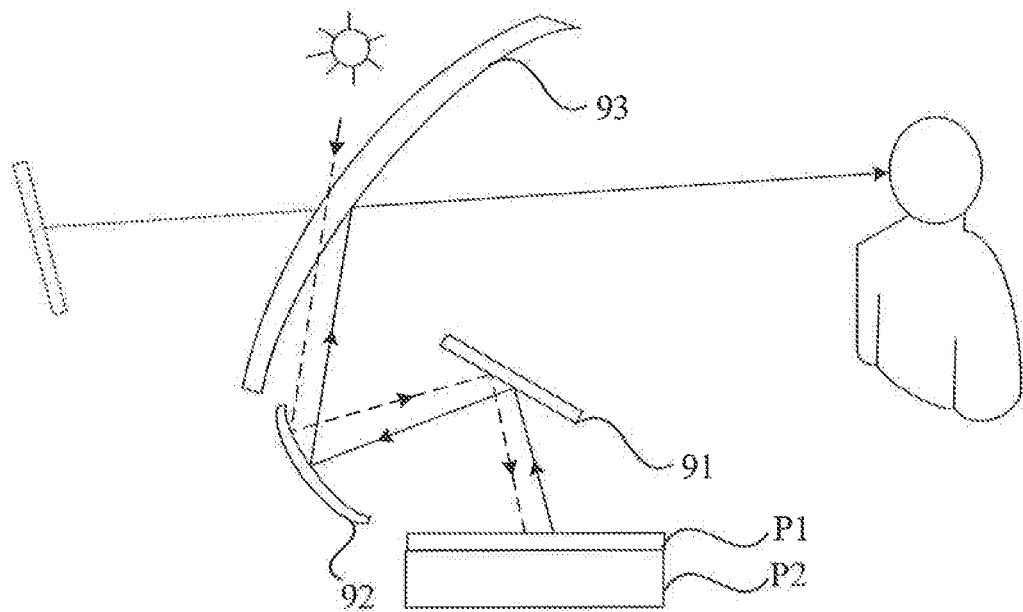
FIG. 24 is a light path diagram of a display device according to an embodiment of the present disclosure.
Figure 25:
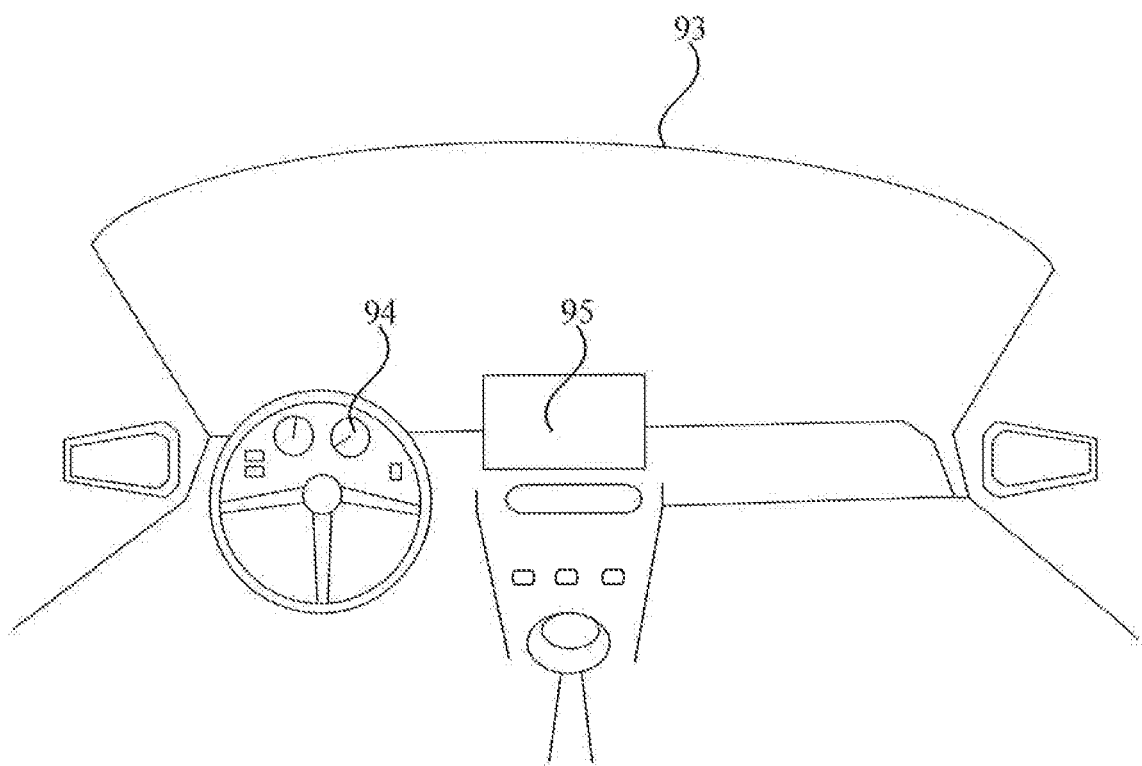
FIG. 25 is a schematic diagram illustrating a display device is disposed in a vehicle according to an embodiment of the present disclosure.

FIG. 23 is a light path diagram of a display device according to the related art. Referring to FIG. 23, the display device is disposed in a vehicle. The display device includes a display box P2, a planar mirror 91 and a concave mirror 92. The vehicle includes a windshield 93. After external ambient light passes through the windshield 93 and is projected to the concave mirror 92, the light is reflected by the concave mirror 92 and the plane mirror 91 to the display box P2. After reflected by the display box P2, the light is projected to the plane mirror 91 and the concave mirror 92, and then is projected to the windshield 93. After reflected by the windshield 93, the light can be observed by a user, thereby creating a bright spot virtual image FIG. 24 is a light path diagram of a display device according to an embodiment of the present disclosure. FIG. 25 is a schematic diagram illustrating a display device is disposed in a vehicle according to an embodiment of the present disclosure. Referring to FIGS. 24 and 25, the display device includes the display panel of the embodiments above. The display panel includes a display box P2 and a low reflection structure P1 located on a display side of the display box P2. Thereby, external ambient light is not reflected by the low reflection structure P1, thus reducing the reflectivity to the external ambient light and improving the display effect of the display device. The display device may further include a well-known structure, for example, a drive board of the display panel, which is not repeated here.

In an embodiment, referring to FIG. 24 and FIG. 25, the display device is disposed in the vehicle, and the vehicle includes a main driving seat, an instrument panel 94 and a windshield 93. The display device is located inside the instrument panel 94. Generally, the instrument panel is located below the windshield 93. The display device further includes a planar mirror 91 and a concave mirror 92. The planar mirror 91 and the concave mirror 92 are located on an optical path between the display panel and the windshield 93. Light emitted from the display box P2 passes through the low reflection structure P1 and is incident on the planar mirror 91. Then, the light is reflected by the planar mirror 91 to the concave mirror 92, and is reflected by the concave mirror 92 to the windshield 93. After reflected by the windshield 93, the light reaches eyes of a user to form a virtual image on one side of the windshield 93 away from the user, that is, implementing a head-up display. After external ambient light passes through the windshield 93 and is projected to the concave mirror 92, the light is reflected to the display panel by the concave mirror 92 and the planar mirror 91 and is absorbed by the low reflection structure P1 in the display panel. Thereby, the light cannot be reflected to the planar mirror 91 and thus cannot be visible to the user, so that no bright spot virtual image is created, which is conductive to improving the display image quality of the display device in the vehicle.

In an embodiment, referring to FIG. 25, the vehicle may further be provided with a center console 95 and a joy stick. The center console 95 is located between the windshield 93 and the joy stick. The display device may be located inside the center console 95. That is, the display device may be not only a display device located at the position of the instrument panel 94, but also a display device located at the position of the center console 95.

Figure 26:
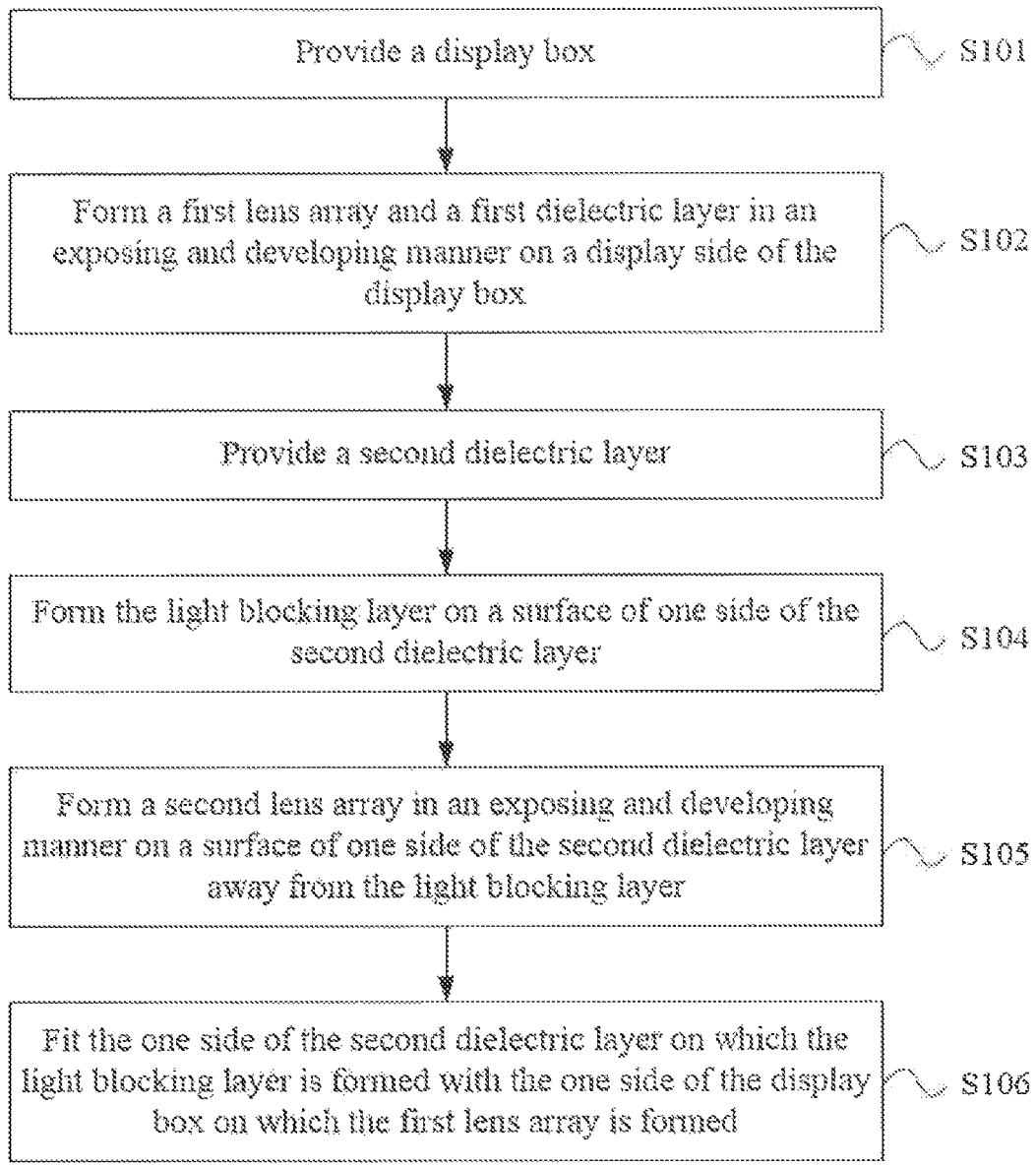
FIG. 26 is a flowchart of a manufacturing method of a display panel according to an embodiment of the present disclosure.
Figure 28:
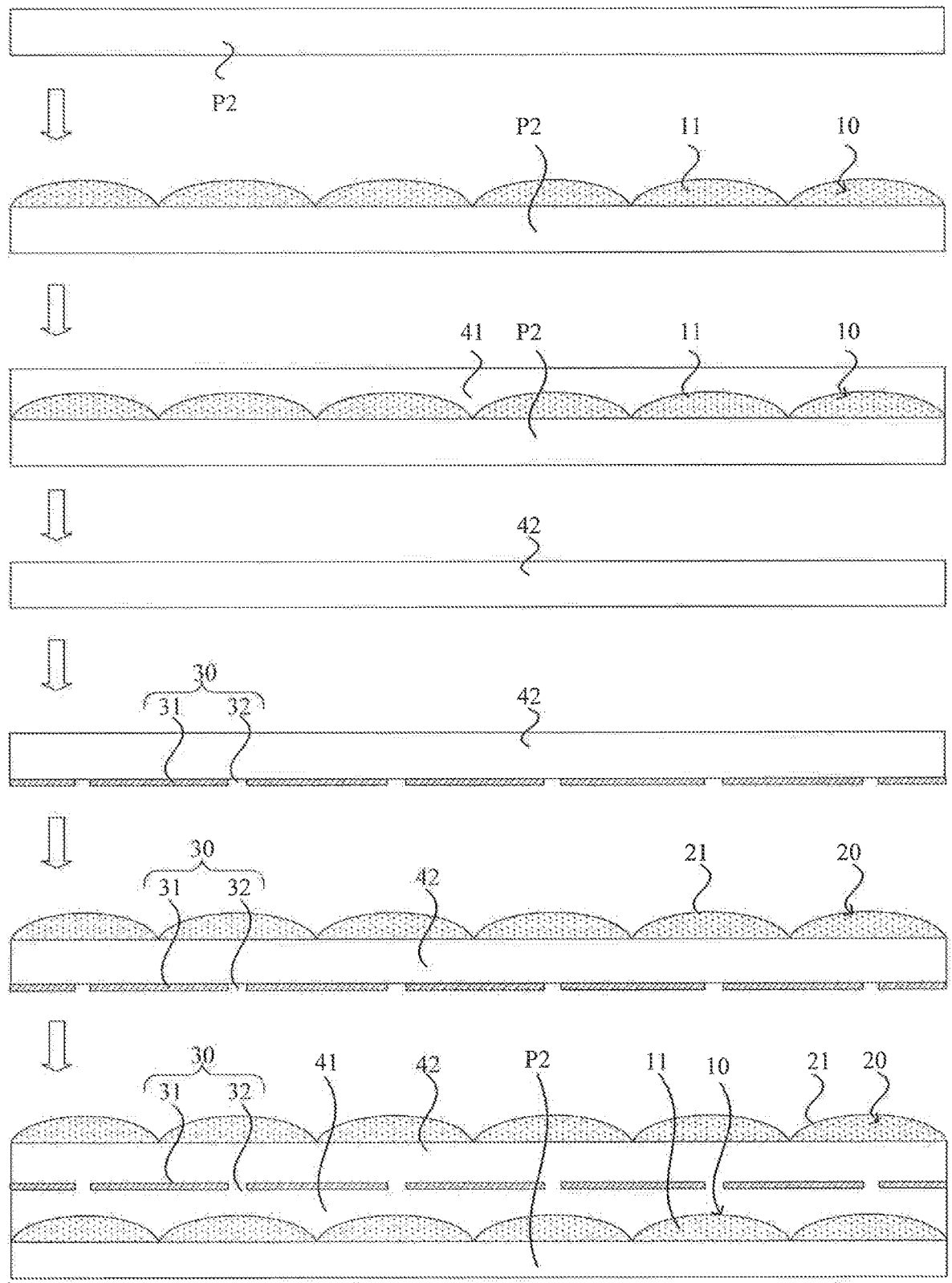
FIG. 28 is a schematic diagram of a manufacturing process of a display panel corresponding to the manufacturing method of FIG. 27.

An embodiment of the present disclosure further provides a manufacturing method of a display panel. FIG. 26 is a flowchart of a manufacturing method of a display panel according to an embodiment of the present disclosure. The manufacturing method of a display panel further provided by the embodiment of the present disclosure can be used to form the display panels in the embodiments above. For ease of understanding, the manufacturing method in this embodiment of the present disclosure is to be described in conjunction with schematic diagrams of the manufacturing process of the display panel in subsequent embodiments. Referring to FIG. 26 and FIG. 28, the manufacturing method of the display panel includes the steps described below.

In step S101, a display box P2 is provided.

The display box P2 may include, for example, a color resist and a color film substrate. Alternatively, the display box P2 may include, for example, a film packaging layer. The display box P2 is used for a light emitting display to form an image.

In step S102, a first lens array 10 and a first dielectric layer 41 are formed in an exposing and developing manner on a display side of the display box P2.

The exposing and developing manner refers to performing photoresist coating, exposing and developing photoresist to form a pattern. In some embodiments, the exposing and developing manner may further include a process of etching the developed pattern, so as to transfer the pattern of the photoresist to the substrate.

The first lens array 10 includes multiple first convex lenses 11. A first convex lens 11 of the multiple first convex lenses may be a planoconvex lens. As shown in FIG. 28, a curved surface of the first convex lens 11 may be convex away from the display box P2. In other embodiments, the curved surface of the first convex lens 11 may be convex toward the display box P2.

In step S103, a second dielectric layer 42 is provided.

In this step, the second dielectric layer 42 may be used as a substrate for forming of a light blocking layer 30 and the second lens array 20 subsequently.

In step S104, the light blocking layer 30 is formed on a surface of one side of the second dielectric layer 42.

The light blocking layer 30 includes a light blocking part 31 and multiple light transmitting parts 32. The light blocking part 31 at least partially surrounds the multiple light transmitting parts 32.

In this step, for example, a light absorbing material layer may be formed on surface of one side of the second dielectric layer 42, and an opening may be formed in the light absorbing material layer. Thus, openings are formed as the multiple light transmitting parts 32 of the light blocking layer 30, and the part other than the openings is formed as the light blocking part 31 of the light blocking layer 30.

In step S105, a second lens array 20 is formed in an exposing and developing manner on a surface of one side of the second dielectric layer 42 away from the light blocking layer 30.

The second lens array 20 includes multiple second convex lenses 21. As shown in FIG. 28, a curved surface of a second convex lens 21 of the multiple second convex lenses 21 may be convex away from the second dielectric layer 42. In other embodiments, the curved surface of the second convex lens 21 may be convex toward the second dielectric layer 42.

In step S106, the one side of the second dielectric layer 42 on which the light blocking layer 30 is formed is fitted with the one side of the display box P2 on which the first lens array is formed.

After the one side of the second dielectric layer 42 on which the light blocking layer 30 is formed is fitted with the one side of the display box P2 on which the first lens array 10 is formed, an image focal plane of the first convex lens 11 and an object focal plane of the second convex lens 21 are within a same plane. That is, a focal plane of the first convex lens 11 is coplanar with a focal plane of the second convex lens 21. A focus of the first convex lens 11 is located within a light transmitting part 32 of the multiple light transmitting parts 32.

In this embodiment of the present disclosure, the first lens array 10 is formed on the display box P2, and the second lens array 20 and the light blocking layer 30 are formed on two opposite sides of the second dielectric layer 42. Since formed on two different substrates, the first lens array 10 and the second lens array 20 may be formed simultaneously, thus improving the manufacturing efficiency of the display panel. The display panel formed by using the manufacturing method in this embodiment of the present disclosure can implement a requirement for both low reflectivity and high hue simultaneously.

Figure 27:
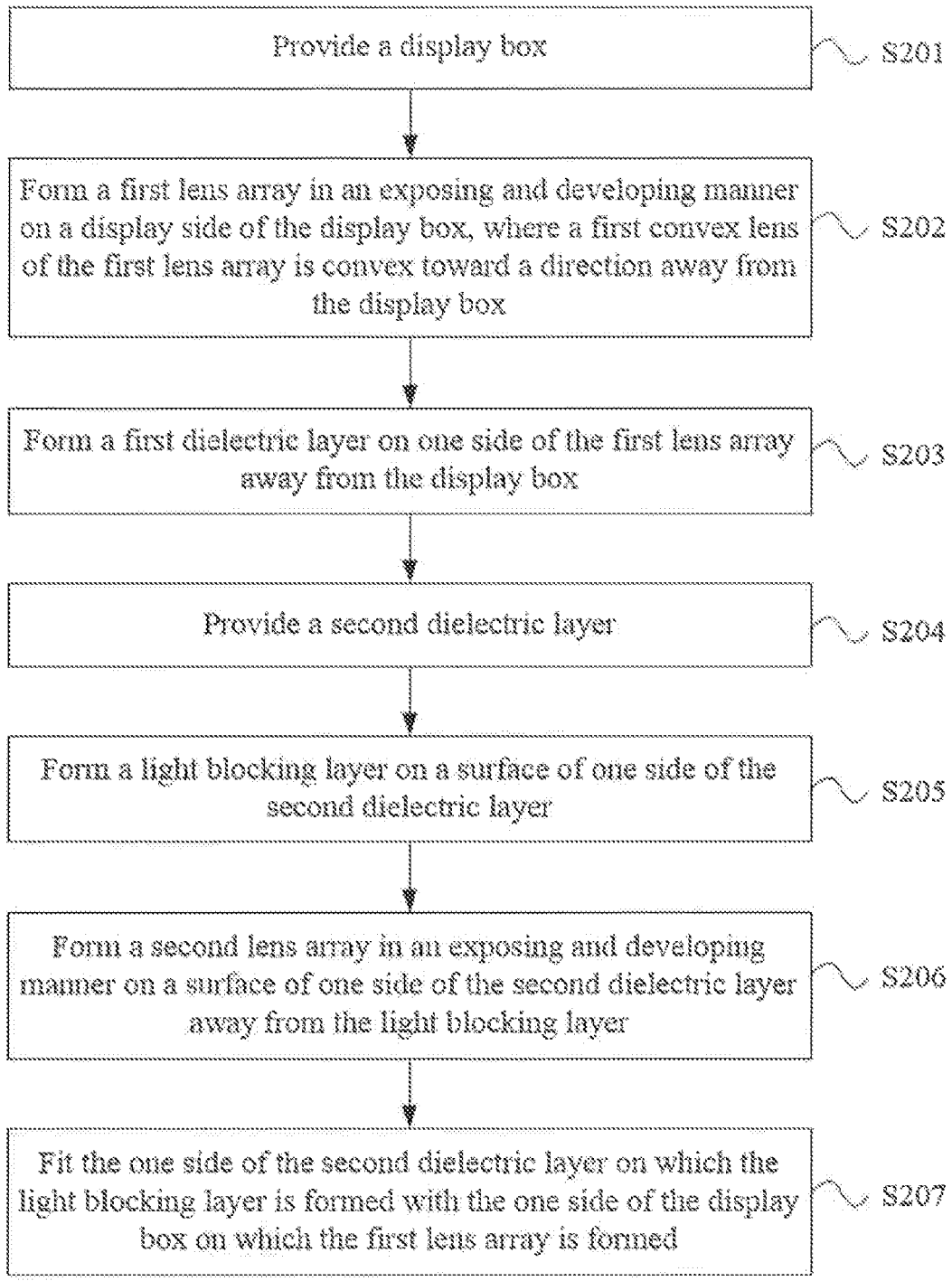
FIG. 27 is a flowchart of a manufacturing method of another display panel according to an embodiment of the present disclosure.

FIG. 27 is a flowchart of a manufacturing method of another display panel according to an embodiment of the present disclosure. FIG. 28 is a schematic diagram of a manufacturing process of a display panel corresponding to the manufacturing method of FIG. 27. Referring to FIG. 27 and FIG. 28, the manufacturing method of a display panel includes the steps described below.

In step S201, a display box P2 is provided.

In step S202, a first lens array 10 is formed in an exposing and developing manner on a display side of the display box P2. A first convex lens of the first lens array is convex toward a direction away from the display box P2.

In this step, for example, a first lens material layer may be formed on the display side of the display box P2; then, the first lens material layer is coated with photoresist, and the photoresist is exposed and developed to form a pattern; after that, the pattern of the photoresist is transferred to a substrate in an etching manner, so that the first lens material layer is etched to form the first lens array 10.

In step S203, a first dielectric layer 41 is formed on one side of the first lens array 10 away from the display box P2.

In this step, the first dielectric layer 41 covers the first lens array 10 and forms a flat surface on the one side of the first lens array 10 away from the display box P2.

In step S204, a second dielectric layer 42 is provided.

In step S205, a light blocking layer 30 is formed on a surface of one side of the second dielectric layer 42.

In step S206, a second lens array 20 is formed in an exposing and developing manner on a surface of one side of the second dielectric layer 42 away from the light blocking layer 30.

In step S207, the one side of the second dielectric layer 42 on which the light blocking layer 30 is formed is fitted with the one side of the display box P2 on which the first lens array 10 is formed.

Figure 29:
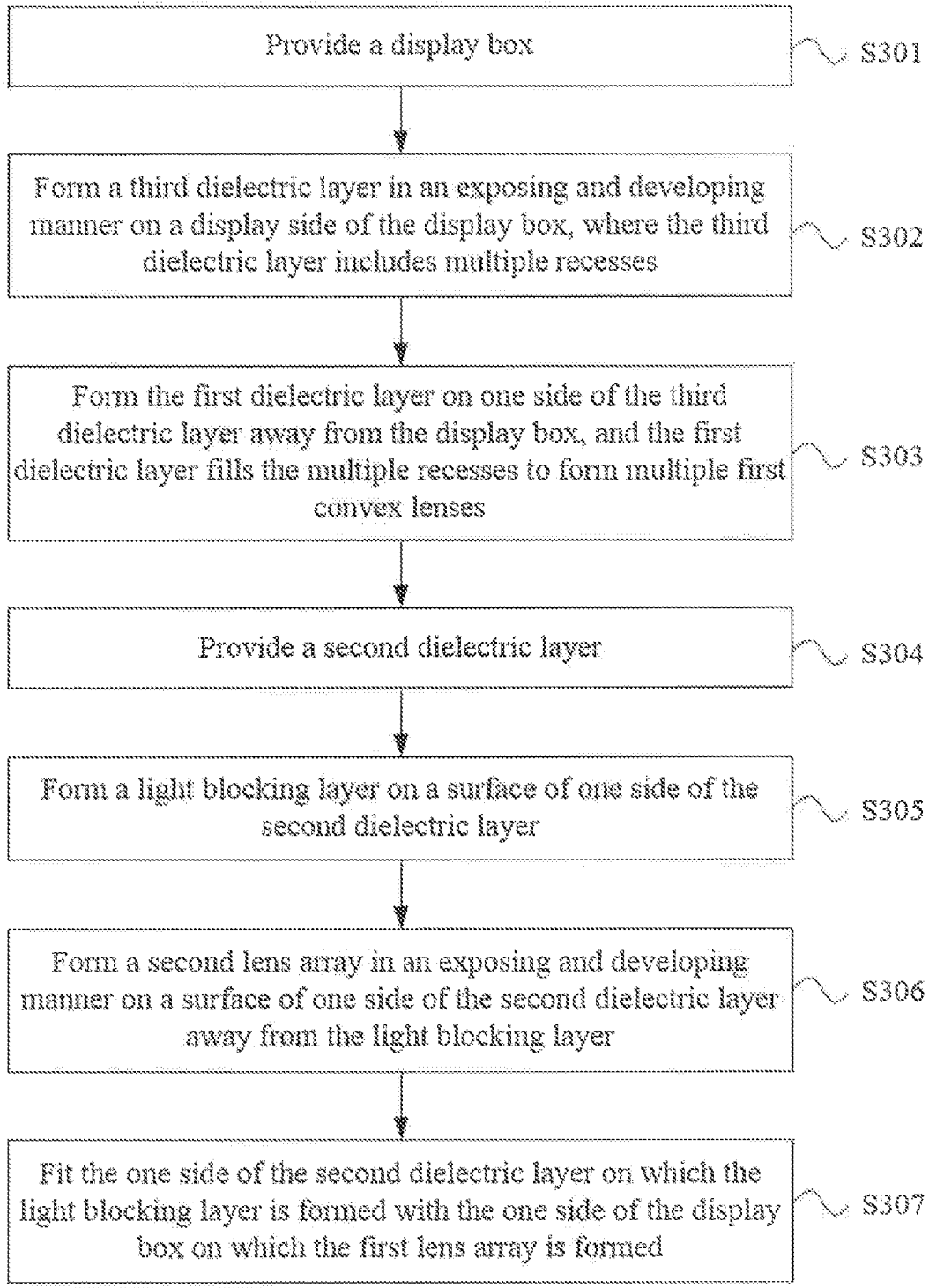
FIG. 29 is a flowchart of a manufacturing method of another display panel according to an embodiment of the present disclosure.
Figure 30:
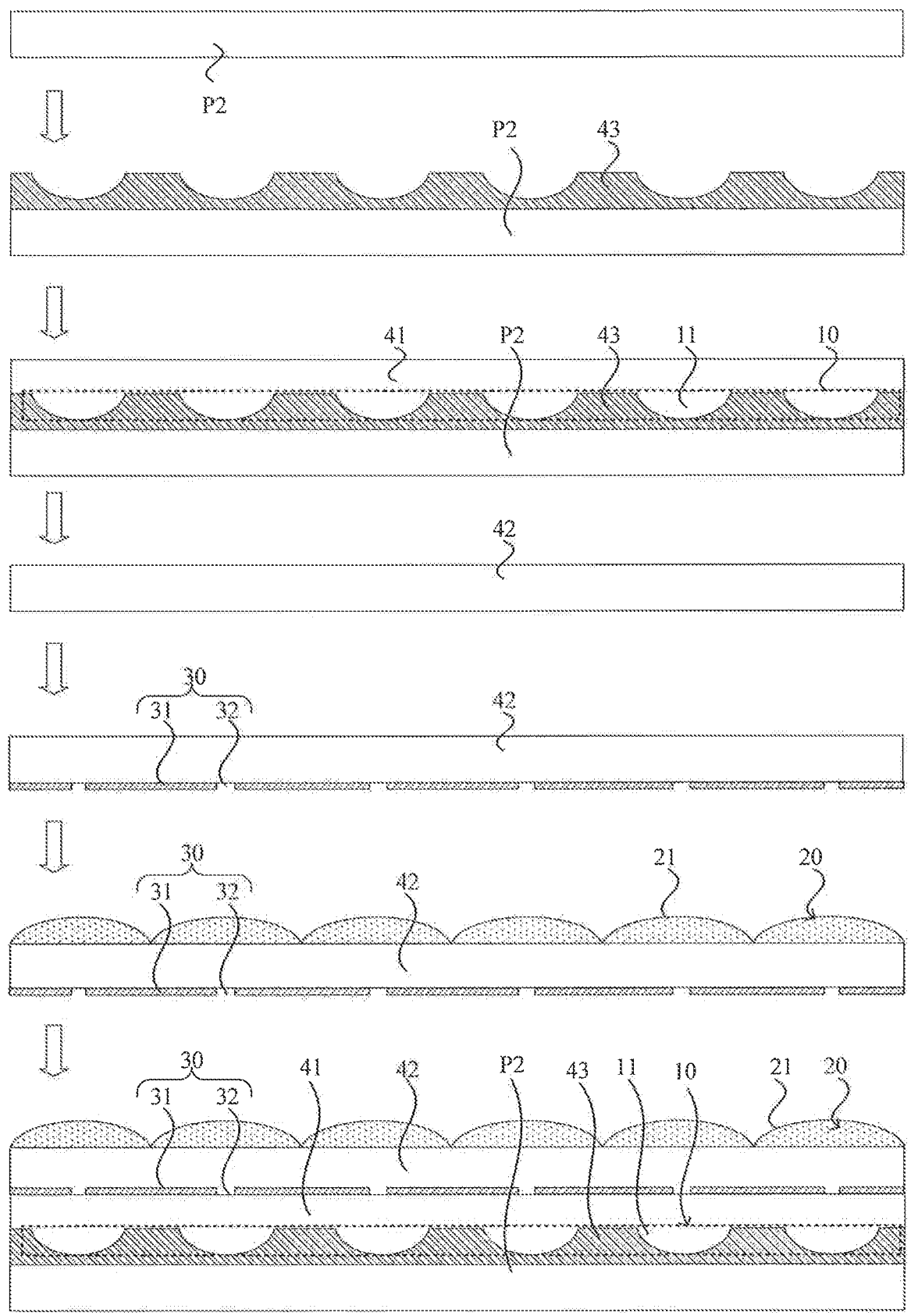
FIG. 30 is a schematic diagram of a manufacturing process of a display panel corresponding to the manufacturing method of FIG. 29.

FIG. 29 is a flowchart of a manufacturing method of another display panel according to an embodiment of the present disclosure. FIG. 30 is a schematic diagram of a manufacturing process of a display panel corresponding to the manufacturing method of FIG. 29. Referring to FIGS. 29 and 30, the manufacturing method of a display panel includes the steps described below.

In step S301, a display box P2 is provided.

In step S302, a third dielectric layer 43 is formed in an exposing and developing mode on a display side of the display box P2. The third dielectric layer 43 includes multiple recesses.

In this step, for example, a third dielectric material layer may be formed on the display side of the display box P2; then, the third dielectric material layer is coated with photoresist, and the photoresist is exposed and developed to form a pattern; after that, the pattern of the photoresist is transferred to the third dielectric material layer in an etching manner, so that the third dielectric material layer is etched to form the third dielectric 43.

In step S303, the first dielectric layer 41 is formed on one side of the third dielectric layer 43 away from the display box P2, and the first dielectric layer fills the plurality of recesses to form the multiple first convex lenses 11.

In this step, the first dielectric layer 41 covers the third dielectric layer 43, the first dielectric layer 41 fills the multiple recesses of the third dielectric layer 43 on one side adjacent to the third dielectric layer 43 to form the first convex lens 11 convex toward the display box P2, and a flat surface is formed on one side of the first dielectric layer 41 away from the third dielectric layer 43.

In step S304, a second dielectric layer 42 is provided.

In step S305, a light blocking layer 30 is formed on a surface of one side of the second dielectric layer 42.

In step S306, a second lens array 20 is formed in an exposing and developing manner on a surface of one side of the second dielectric layer 42 away from the light blocking layer 30.

In step S307, the one side of the second dielectric layer 42 on which the light blocking layer 30 is formed is fitted with the one side of the display box P2 on which the first lens array 10 is formed.

It is to be noted that the above are merely preferred embodiments of the present disclosure and the technical principles used therein. It is to be understood by those skilled in the art that the present disclosure is not limited to the embodiments described herein. Those skilled in the art can make various apparent modifications, adaptations, combinations and substitutions without departing from the scope of the present disclosure. Therefore, while the present disclosure has been described in detail via the above embodiments, the present disclosure is not limited to the above embodiments and may include other equivalent embodiments without departing from the concept of the present disclosure. The scope of the present disclosure is determined by the scope of the appended claims.

What is claimed is:

1. A low reflection structure, comprising: a first lens array, a second lens array, and a light blocking layer located between the first lens array and the second lens array,
wherein the first lens array comprises a plurality of first convex lenses, the second lens array comprises a plurality of second convex lenses, the light blocking layer comprises a light blocking part and a plurality of light transmitting parts, and the light blocking part at least partially surrounds the plurality of light transmitting parts;
wherein a focus of each first convex lens of the plurality of first convex lenses is located within a light transmitting part of the plurality of light transmitting parts; and
wherein the light blocking part surrounds each of the light transmitting parts for a circle, the plurality of light transmitting parts are arranged in an array along a first direction and a second direction, and the first direction intersects the second direction.

2. The low reflection structure of claim 1, wherein and an image focal plane of the each first convex lens and an object focal plane of each second convex lens of the plurality of second convex lenses are within a same plane.

3. The low reflection structure of claim 1, wherein the plurality of light transmitting parts are formed as light transmitting strips, the light transmitting strips extend along a second direction and are arranged along a first direction, and the first direction intersect the second direction.

4. The low reflection structure of claim 1, wherein every two adjacent first convex lenses of the plurality of first convex lenses are in contact with each other along the first direction, and/or every two adjacent first convex lenses of the plurality of first convex lenses are in contact with each other along the second direction.

5. The low reflection structure of claim 4, wherein every two adjacent first convex lenses of the plurality of first convex lenses are in contact with each other along the first direction.

6. The low reflection structure of claim 4, wherein every two adjacent second convex lenses of the plurality of second convex lenses are in contact with each other along the first direction.

7. The low reflection structure of claim 1, further comprising: a first dielectric layer and a second dielectric layer, wherein the first dielectric layer is located between the light blocking layer and the first lens array, and the second dielectric layer is located between the light blocking layer and the second lens array.

8. The low reflection structure of claim 7, further comprising: a third dielectric layer, which is located on one side of the first lens array away from the light blocking layer,
wherein the plurality of first convex lenses are integrally formed with the first dielectric layer, each first convex lens comprises a first surface, the first surface is a curved surface convex toward the third dielectric layer, and refractivity of the each first convex lens is greater than refractivity of the third dielectric layer.

9. The low reflection structure of claim 7, further comprising: a second lens substrate, which is located on one side of the second lens array away from the light blocking layer and is integrally formed with the plurality of second convex lenses,
 wherein each second convex lens of the plurality of second convex lenses comprises a third surface, the third surface is a curved surface convex toward the second dielectric layer, and refractivity of the second dielectric layer is less than refractivity of the each second convex lens.

10. The low reflection structure of claim 1, wherein the plurality of second convex lenses and the plurality of first convex lenses have same refractivity.

11. The low reflection structure of claim 1, wherein on a direction vertical to the light blocking layer, a second convex lens of the plurality of second convex lenses overlaps a first convex lens of the plurality of first convex lenses; and
 wherein the first convex lens and the second convex lens are provided with a common optical axis, and the optical axis of the first convex lens and the second convex lens passes through a light transmitting part of the plurality of light transmitting parts.

12. The low reflection structure of claim 1, wherein on a direction vertical to the light blocking layer, two adjacent second convex lenses of the plurality of second convex lenses overlaps a first convex lens of the plurality of first convex lenses along a first direction; and
 wherein an optical axis of the first convex lens passes through a light transmitting part of the plurality of light transmitting parts, and optical axes of the two adjacent second convex lenses are located on two sides of the optical axis of the first convex lens.

13. A display panel, comprising: a display box and a low reflection structure,
 wherein the low reflection structure comprises: a first lens array, a second lens array, and a light blocking layer located between the first lens array and the second lens array,
 wherein the first lens array comprises a plurality of first convex lenses; the second lens array comprises a plurality of second convex lenses, the light blocking layer comprises a light blocking part and a plurality of light transmitting parts, and the light blocking part at least partially surrounds the plurality of light transmitting parts; and
 wherein a focus of each first convex lens of the plurality of first convex lenses is located within a light transmitting part of the plurality of light transmitting parts; and
 wherein the low reflection structure is located on a display side of the display box.

14. The display panel of claim 13, wherein the display box comprises a plurality of pixel units, and a pixel unit of the plurality of pixel units comprises a plurality of sub-pixels of different light emitting colors arranged along a first direction; and
 wherein along the first direction, the each first convex lens covers m sub-pixels of the plurality of sub-pixels, and $1 \leq m \leq 3$.

15. The display panel of claim 14, wherein the pixel unit comprises a first sub-pixel, a second sub-pixel, a third sub-pixel, a fourth sub-pixel, a fifth sub-pixel and a sixth sub-pixel sequentially arranged along the first direction, the first sub-pixel and the sixth sub-pixel have a first light emitting color, the second sub-pixel and the third sub-pixel have a second light emitting color, and the fourth sub-pixel and the fifth sub-pixel have a third light emitting color; and
 wherein along the first direction, the each first convex lens covers two sub-pixels of the plurality of sub-pixels, and two sub-pixels of the plurality of sub-pixels covered by a same first convex lens of the plurality of first convex lenses have different light emitting colors.

16. A display device, comprising the display panel of claim 13.

17. The display device of claim 16, wherein the display device is disposed in a vehicle, the vehicle comprises a main driving seat, an instrument panel and a windshield, and the display device is located inside the instrument panel; and
 wherein the display device further comprises a planar mirror and a concave mirror, the planar mirror and the concave mirror are located on an optical path between the display panel and the windshield.

18. The display panel of claim 13, wherein the light blocking part surrounds each of the plurality of light transmitting parts for a circle, the plurality of light transmitting parts are arranged in an array along a first direction and a second direction, and the first direction intersects the second direction.

19. A manufacturing method of a display panel, comprising:
 providing a display box;
 forming a first lens array and a first dielectric layer in an exposing and developing manner on a display side of the display box;
 providing a second dielectric layer;
 forming a light blocking layer on a surface of one side of the second dielectric layer;
 forming a second lens array in the exposing and developing manner on a surface of one side of the second dielectric layer away from the light blocking layer; and
 fitting the one side of the second dielectric layer on which the light blocking layer is formed with the one side of the display box on which the first lens array is formed,
 wherein the first lens array comprises a plurality of first convex lenses, the second lens array comprises a plurality of second convex lenses, the light blocking layer comprises a light blocking part and a plurality of light transmitting parts, and the light blocking part at least partially surrounds the plurality of light transmitting parts; and a focus of each the first convex lens of the plurality of first convex lenses is within a light transmitting part of the plurality of light transmitting parts.

20. The manufacturing method of claim 19 wherein forming the first lens array and the first dielectric layer in the exposing and developing manner on the display side of the display box comprises:
 forming the first lens array in the exposing and developing manner on the display side of the display box, wherein the plurality of first convex lens of the first lens array are convex toward a direction away from the display box; and
 forming the first dielectric layer on one side of the first lens array away from the display box.

* * * * *